United States Patent
Mazahreh et al.

(10) Patent No.: US 7,266,757 B1
(45) Date of Patent: Sep. 4, 2007

(54) PIPELINED ARCHITECTURE IMPLEMENTING RECURSION PROCESSES FOR FORWARD ERROR CORRECTION

(75) Inventors: Raied N. Mazahreh, Salt Lake City, UT (US); Edwin J. Hemphill, Kaysville, UT (US)

(73) Assignee: Xilinx, Inc., San Jose, CA (US)

( * ) Notice: Subject to any disclaimer, the term of this patent is extended or adjusted under 35 U.S.C. 154(b) by 626 days.

(21) Appl. No.: 10/769,662

(22) Filed: Jan. 29, 2004

(51) Int. Cl.
*H03M 13/03* (2006.01)

(52) U.S. Cl. .................. 714/794; 714/796; 714/774; 714/786

(58) Field of Classification Search ................ 714/794, 714/796, 786, 755, 752, 753
See application file for complete search history.

(56) References Cited

U.S. PATENT DOCUMENTS

| | | | |
|---|---|---|---|
| 6,304,996 B1 * | 10/2001 | Van Stralen et al. | 714/796 |
| 6,718,504 B1 * | 4/2004 | Coombs et al. | 714/755 |
| 2003/0097633 A1 * | 5/2003 | Nguyen | 714/786 |

* cited by examiner

*Primary Examiner*—Guy Lamarre
*Assistant Examiner*—Fritz Alphonse
(74) *Attorney, Agent, or Firm*—LeRoy D. Maunu

(57) ABSTRACT

A method and apparatus for performing a recursion process on a data block for error correction. The disclosure describes concurrently operating pipelined sub-processes that decode the data block with error correction. The pipelined sub-processes are implemented as sub-circuits of an integrated circuit. The output data from each sub-process is stored for input by a subsequent sub-process of the pipelined sub-processes.

38 Claims, 18 Drawing Sheets

PIPELINED ARCHITECTURE IMPLEMENTING RECURSION PROCESSES FOR FORWARD ERROR CORRECTION

FIELD OF THE INVENTION

The present invention generally relates to a pipelined approach for implementing a recursion process.

BACKGROUND

New types of communication services are being introduced at an increasing rate, driving the demand for higher data rates and communication capacity. With the advent of high-speed logic circuits, data communication equipment has overwhelmingly moved toward digital implementations. The progress of communication systems is in part due to performance increases and cost reductions of digital circuit technology. Advancements in digital communication systems have also been based on significant theoretical developments. For example, Shannon's establishment of the fundamental limits on the transmission rates in digital communications motivated the search for coding techniques to approach the capacity limit.

Data communication signals transmitted over noisy channels are susceptible to errors caused by the interference. Various methods have been developed to minimize the effect of interference on the transmitted data. Digital systems are generally more reliable in noisy communications environments. Error correction coding involves representing the data in such a way that errors may be corrected. Further, digital data can be encoded in such a way that introduces dependency among a large number of symbols, thus enabling the receiver to make a more accurate detection of the symbols. This technique is known as forward error correction or error control coding.

The two most commonly used types of forward error correction codes are block codes and convolutional codes. Block codes involve operations that depend on the current input message and are independent of previous encodings. In contrast, operation of a convolutional code involves output sequences that depend not only on the current input message, but also on a number of past message blocks. Recursion algorithms used in convolutional coding may include a number of recursive steps to achieve a desired level of accuracy. The recursive steps require additional processing time that slows down the communication processes. There exists a need in the communication industry for methods and systems to increase the speed of digital communications systems.

SUMMARY OF THE INVENTION

The present invention involves methods and systems for pipelining recursion processes for forward error correction. In accordance with one embodiment of the invention, a method of performing a recursion process for error correction on a data block involves concurrently operating pipelined sub-processes of the recursion process for error correction on the data block. The pipelined sub-processes are implemented in an integrated circuit. The output of each sub-process is stored for input by a subsequent sub-process of the pipelined sub-processes.

In accordance with another embodiment of the invention, a method of performing a forward/backward recursion process for error correction in decoding an encoded data block includes dividing the encoded data block into data windows. Pipelined sub-processes of the forward/backward recursion process are concurrently operated to decode the data windows. The output of each sub-process is stored for input by a subsequent sub-process of the pipelined sub-processes.

In accordance with a further embodiment of the invention, a data decoder sub-system includes an input circuit configured to receive an encoded data block. The data decoder sub-system also includes one or more processors coupled to the input circuit and implemented in an integrated circuit. The one or more processors are configured to concurrently operate pipelined sub-processes to perform a recursion process to decode the data block with error correction. The one or more processors further include one or more storage elements configured to store the output of each sub-process for input by a subsequent sub-process of the pipelined sub-processes.

Another embodiment of the invention involves a turbo decoder system. The turbo decoder system includes an input circuit configured to receive a data block. One or more soft input soft output decoders are coupled to the input circuit. At least one of the soft input soft output decoders includes a gamma calculator, an alpha/beta recursion processor, and a log-likelihood ratio processor. The gamma calculator is configured to calculate a state transition probability produced by a particular input bit. The alpha/beta recursion processor is configured to concurrently operate pipelined sub-processes to perform an alpha/beta recursion process in decoding the data block. The alpha/beta recursion processor also includes one or more storage elements configured to store the output of each sub-process for input by a subsequent sub-process of the pipelined sub-processes. The log likelihood ratio processor is coupled to the gamma calculator and the alpha/beta processor. The log likelihood ratio processor is configured to provide an estimate of a transmitted data block.

Various embodiments are set forth in the Detailed Description and Claims that follow.

BRIEF DESCRIPTION OF THE DRAWINGS

Various aspects and advantages of the invention will become apparent upon review of the following detailed description and upon reference to the drawings in which.

DETAILED DESCRIPTION

Methods and systems are described herein for pipelining the recursion processes of various types of error correction coding schemes. Embodiments of the invention are generally presented in the context of turbo convolutional coding, although methods and systems described herein are equally applicable to other types of error correction coding implementations.

Turbo convolutional coding is used in a large number of wireless communication systems, for example, third generation (3G) wireless and code division multiple access (CDMA) environments. Turbo codes provide a powerful mechanism for protecting data payloads and are expected to become increasingly important as advances in communications technologies extend to fourth generation and post fourth generation wireless markets.

In systems involving turbo convolutional coding (TCC) with forward error correction, the TCC decoder presents implementation challenges, particularly when high data rates are involved. As successive communication technologies are deployed, data rates will increase, compounding the implementation challenges. The limiting aspect of the turbo decoder is the recursive nature of the maximum a posteriori (MAP) decoder. Various embodiments of the invention are directed to a pipelined approach for implementing the recursive operations. For example, a MAP decoder may be implemented using a pipelined architecture described in accordance with embodiments of the invention for performing the forward/backward recursions.

The approaches described herein with reference to the various embodiments may be implemented in an integrated circuit and are particularly advantageous when used in field programmable gate arrays (FPGAs) or other programmable logic devices. However, the approaches illustrated by the various embodiments are equally beneficial when implemented in application specific integrated circuits (ASICs).

Figure 1A:
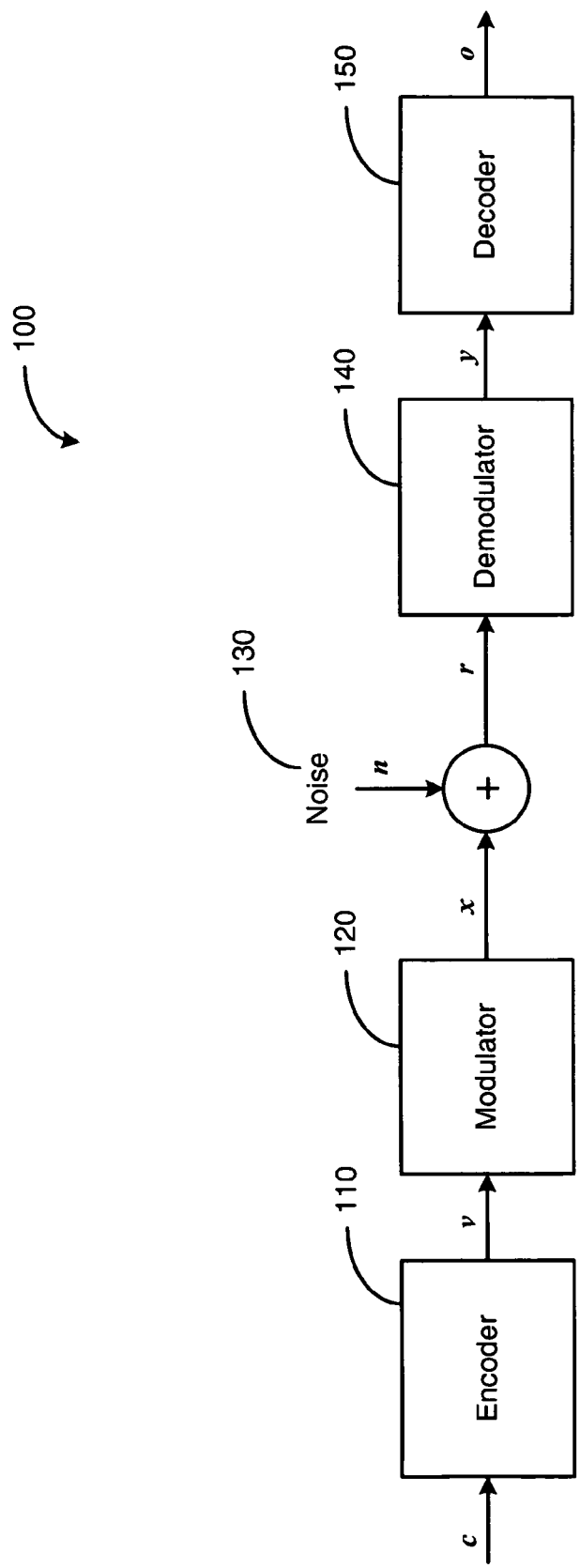
FIG. 1A illustrates a system model for a communication system employing a decoder arranged in accordance with embodiments of the invention.

Various embodiments of the invention are described in connection with a MAP decoder employed in a turbo convolutional coding (TCC) decoder. The block diagram of FIG. 1A illustrates a system model for a communication system 100 employing a decoder arranged in accordance with embodiments of the invention. A binary message sequence denoted by c and given by:

$$c = (c_1, c_2, \ldots, c_t, \ldots c_N), \quad [1]$$

where $c_t$ is the message symbol at time t and N is the message length as encoded in an encoder 110.

Typically the message sequences are independently generated binary symbols and have equal a priori probabilities. The encoding operation produces a sequence that from time 1 to t may be represented as:

$$v_1^t = (v_1, v_2, \ldots v_t) \quad [2]$$

where $$v_t = (v_{t,0}, v_{t,1}, \ldots v_{t,n-1}). \quad [3]$$

The code sequence $$v_1^t$$

is modulated by a modulator 120. The modulated sequence is denoted by:

$$x_1^t = (x_1, x_2, \ldots x_t) \quad [4]$$

where $$x_t = (x_{t,0}, x_{t,1}, \ldots x_{t,n-1}). \quad [5]$$

As there is a one-to-one correspondence between the code and the modulated sequence, the encoder/modulator pair can be represented by a discrete-time finite state Markov process and can be graphically described by state or trellis diagrams. The modulated sequence $$x_1^t$$

is corrupted by additive noise 130, resulting in the received sequence:

$$r_1^t = (r_1, r_2, \ldots r_t) \quad [6]$$

where $$r_t = (r_{t,0}, r_{t,1}, \ldots r_{t,n-1}). \quad [7]$$

and $$r_t = x_{t,i} + n_{t,i} \; i = 0, 1, \ldots, n-1 \quad [8]$$

The received signal is demodulated in a demodulator 140 and decoded. The decoder 150 gives an estimate of the input to the discrete finite-state Markov encoder process by examining the demodulated sequence y. The encoder 110 operates as a finite state machine (FSM). As a bit enters the encoder 110, it traverses through a sequence of non-arbitrary state transitions that are constrained by the encoding algorithm. Because of these constraints, the legitimate transmitted sequences are restricted to certain bit patterns. Given the received bit stream, the decoder 150 produces an estimate of the original unencoded information sequence. If there are transmission errors, the decoder 150 may conclude that such an encoded sequence could not have been generated by the encoder 110 and that the sequence must be due to channel errors. In this case, the decoder 150 may attempt to choose the legitimately encoded sequence that most resembles the demodulated sequence.

The MAP algorithm may be employed in a decoder to provide the estimated bit sequence (hard estimate) and also the probabilities (soft output) for each bit that has been decoded. For each transmitted symbol, the MAP algorithm generates its hard estimate and soft output in the form of the a posteriori probability on the basis of the demodulated sequence y. The MAP algorithm computes the log-likelihood ratio:

$$\Lambda(c_t) = \log \frac{Pr\{c_t = 1 \mid y\}}{Pr\{c_t = 0 \mid y\}} \quad \text{for } 1 \leq t \leq \tau \qquad [9]$$

where $\tau$ is the received length. The value $\Lambda(c_t)$ represents the soft information associated with the hard estimate for $c_t$:

$$c_t = \begin{cases} 1 & \Lambda(c_t) \geq 0 \\ 0 & \text{otherwise} \end{cases} \qquad [10]$$

Soft outputs involve a measure of confidence associated with the estimate. For example, the soft output of a decoder may be +0.8, implying that the transmitted signal is likely to have been +1 and the confidence measure of the decision is 0.8. Soft information, denoted extrinsic information, may be used by the next decoding stages to determine the accumulated path metrics. The value of a received bit may be estimated in the decoder based on a path associated with stronger accumulated confidence.

Figure 1B:
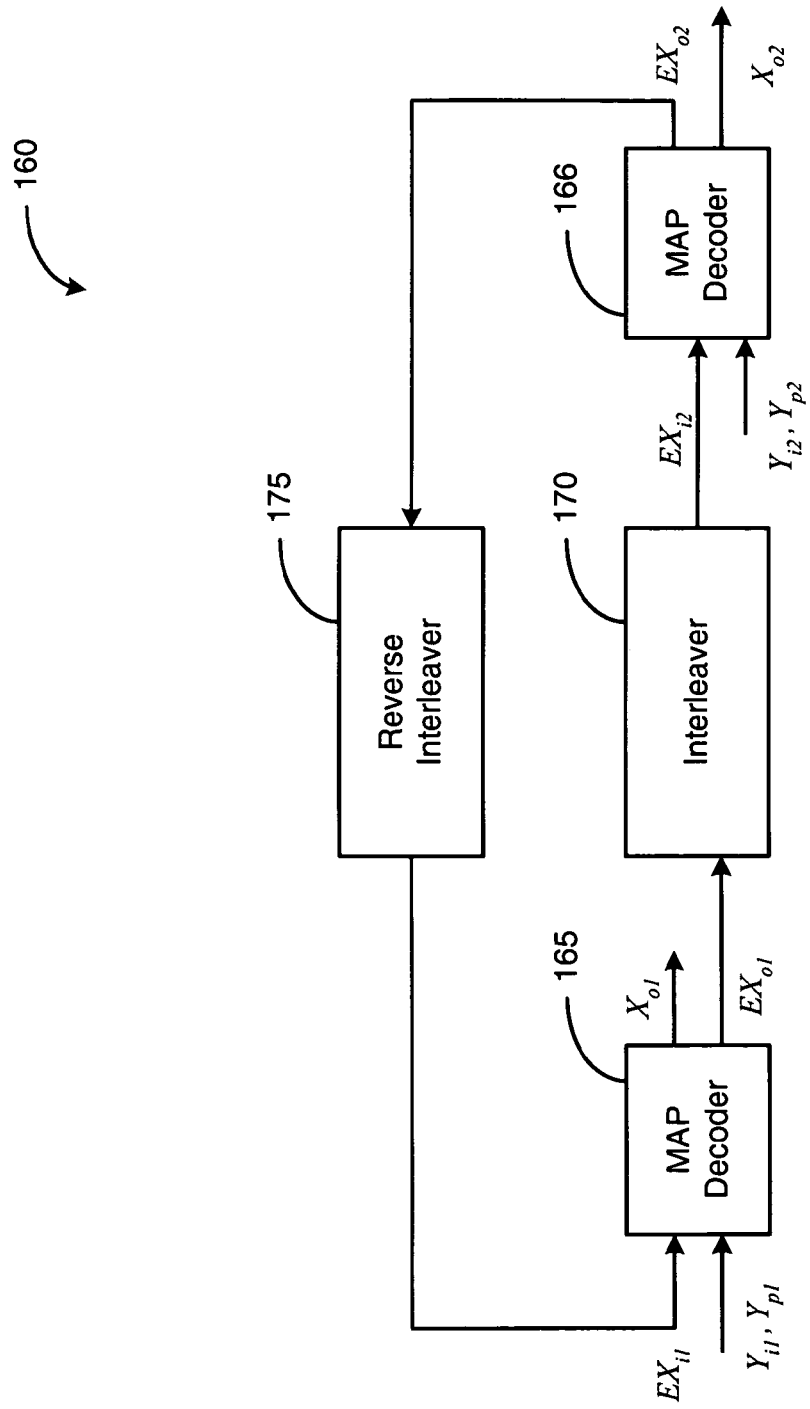
FIG. 1B illustrates a block diagram of a turbo convolutional coding decoder that may be implemented using a pipelined recursion process in accordance with embodiments of the invention.

The block diagram of FIG. 1B illustrates a TCC decoder 160 that may be implemented using a pipelined recursion process in accordance with embodiments of the invention. In this example, the TCC decoder 160 includes two constituent MAP soft-input-soft-output (SISO) decoders 165, 166. Data input bits $Y_{i1}$ and a first set of parity bits $Y_{p1}$ are applied to the data input of the first SISO decoder 165. The first SISO decoder 165 computes the log likelihood ratio of the output given the input sequence. The extrinsic input $EX_{i1}$, associated with the metrics information, initially has a null input applied. The data output $X_{o1}$ of the first SISO decoder 165 is discarded. The extrinsic output $EX_{o1}$, is applied to the input of an interleaver 170. The interleaver 170 rearranges the bits of the extrinsic signal $EX_{o1}$. The interleaved extrinsic signal is applied to the extrinsic input $EX_{i2}$ of the second SISO decoder 166. Data input bits $Y_{i2}$ and a second set of parity bits $Y_{p2}$ are applied to the data input of the second SISO decoder 166. The second SISO decoder 166 performs a decoding operation based on the parity bits $Y_{p2}$ and interleaved systematic bits $Y_{i2}$, and the bits from the interleaved extrinsic input $EX_{i2}$. The data output $X_{o2}$ of the second SISO decoder 166 provides the decoded data.

The TCC decoder 160 represented in FIG. 1B may not provide adequately decoded data in one pass. It is typically utilized in an iterative architecture. The extrinsic output of the second SISO decoder 166 is applied to the input of an inverse interleaver 175. The inverse interleaver 175 restores the bits to their previous order. The output of the inverse interleaver 175 is applied to the extrinsic input $EX_{i1}$ of the first SISO decoder 165. In the iterative decoding situation, with the extrinsic information from the second SISO decoder 166 fed back to the first SISO decoder 165. The encoded data will be decoded repeatedly with better and better extrinsic values. The number of iterations may be predetermined and is associated with the convergence of the extrinsic values to values corresponding to high confidence levels.

Figure 1C:
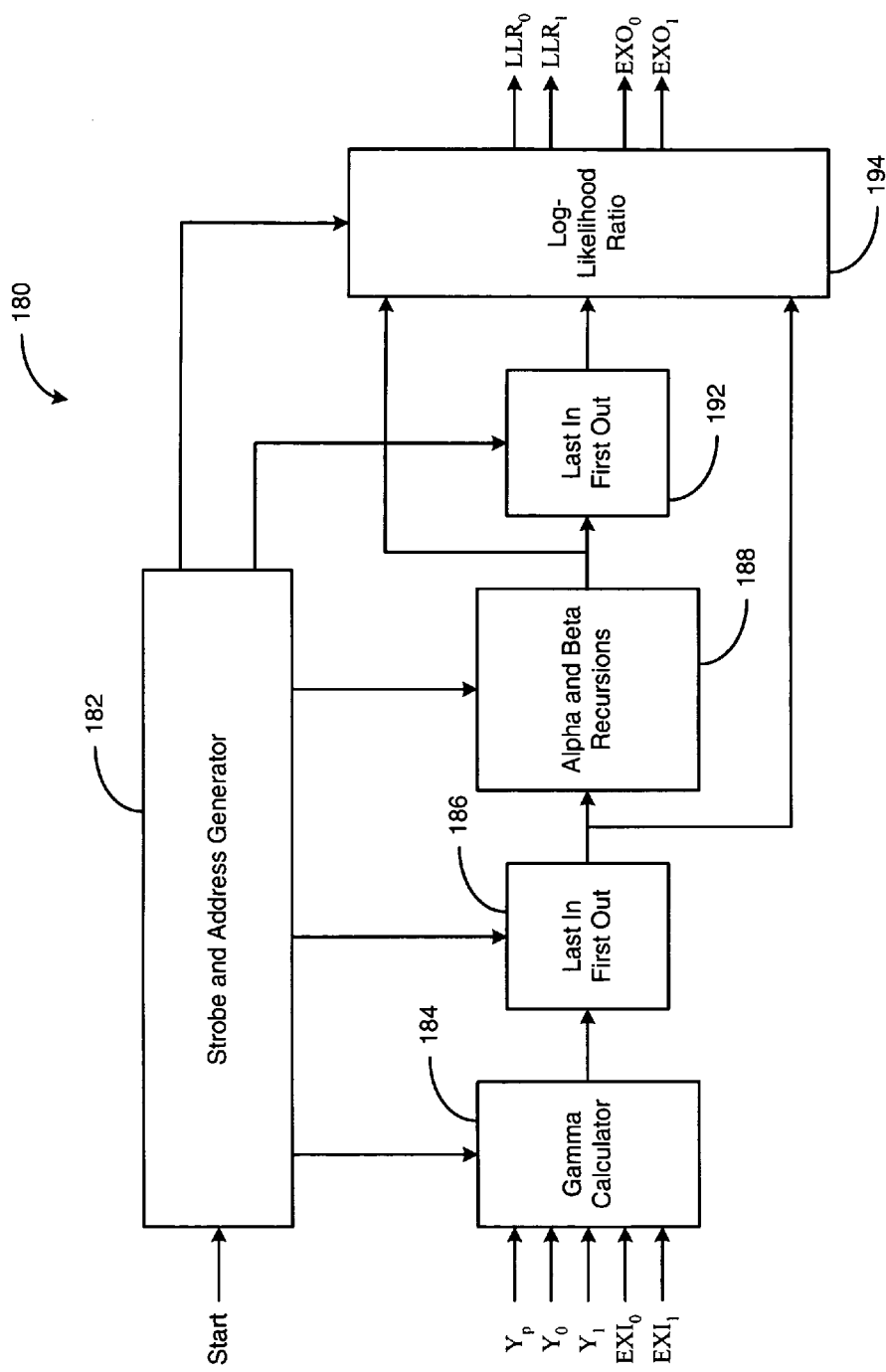
FIG. 1C is a block diagram illustrating a soft input soft output MAP decoder in which recursion processes in accordance with embodiments of the invention may be implemented.

FIG. 1C is a block diagram illustrating a soft-input-soft-output MAP decoder 180 in which recursion processes in accordance with embodiments of the invention may be implemented. The MAP decoder 180 may include a strobe and address generator 182 that indicates the beginning of a data block and coordinates the timing of operations of the MAP decoder 180. As previously described, the MAP decoder 180 calculates the log likelihood ratio estimate associated with a transmitted data sequence. The MAP algorithm is based on three probabilities, denoted the gamma, alpha and beta probabilities. The gamma probability is calculated in the gamma calculator, and estimates the probability that the encoder state machine was in state s' at time k−1, it moves to state s, and the received input sequence for this transition is $y_k$. The gamma probability may be expressed as:

$$\gamma_k(s',s) = P(\{y_k, S_k = s\} \mid S_{k-1} = s') \qquad [11]$$

The alpha and beta recursion processor generates alpha and beta probabilities. The alpha probability may be expressed as:

$$\alpha_{k-1}(s') = P(S_{k-1} = s', y_{j<k}). \qquad [12]$$

The alpha probability represents the probability that the encoder state machine was in state s' at time k−1 and the received channel sequence up to this point is $y_{j<k}$. Calculation of the alpha probability involves a forward recursion.

The beta probability may be expressed as:

$$\beta_k(s) = P(y_{j>k} \mid S_k = s) \qquad [13]$$

The beta probability represents the probability that, given the state machine is in state s at time k, the future received channel sequence will be $y_{j<k}$.

Given the gamma probability, the alpha and beta probabilities may be calculated recursively as follows:

$$\alpha_k(s) = \sum_s \gamma_k(s', s) \cdot \alpha_{k-1}(s') \qquad [14]$$

$$\beta_{k-1}(s') = \sum_s \beta_k(s) \cdot \gamma_k(s', s). \qquad [15]$$

Calculation of the alpha probability requires forward recursive operations beginning at the left of the received data block or window and progressing to the right. Calculation of the beta probability involves backward recursive operations, e.g., beginning at the right of the received data block or window and progressing to the left.

As illustrated in FIG. 1C, the MAP decoder 180 may include data inputs $Y_0$ and $Y_1$ in a dual binary system. The data inputs along with a parity input $Y_p$ are applied to the input of the gamma calculator 184. Inputs to the gamma calculator 184 may also include the $EXI_0$ and $EXI_1$ inputs for receiving extrinsic soft output information from a previous stage. For the initial iteration, the $EXI_0$ and $EXI_1$ inputs are 0. The output of the gamma calculator may be applied to a first-in-first-out LIFO register 186 and thus to the alpha and beta recursion processor 188.

The output of the alpha and beta recursion processor 188 is applied to a second LIFO 192 and finally to the log-likelihood ratio processor 194. The log-likelihood ratio processor 194 calculates the hard estimate outputs and $LLR_0$ and $LLR_1$ along with the soft outputs $EXO_0$ and $EXO_1$. The extrinsic information may be fed back to the $EXI_0$ and $EXI_1$ inputs or may be passed to the extrinsic inputs of next decoder in a concatenated arrangement.

Figure 1D:
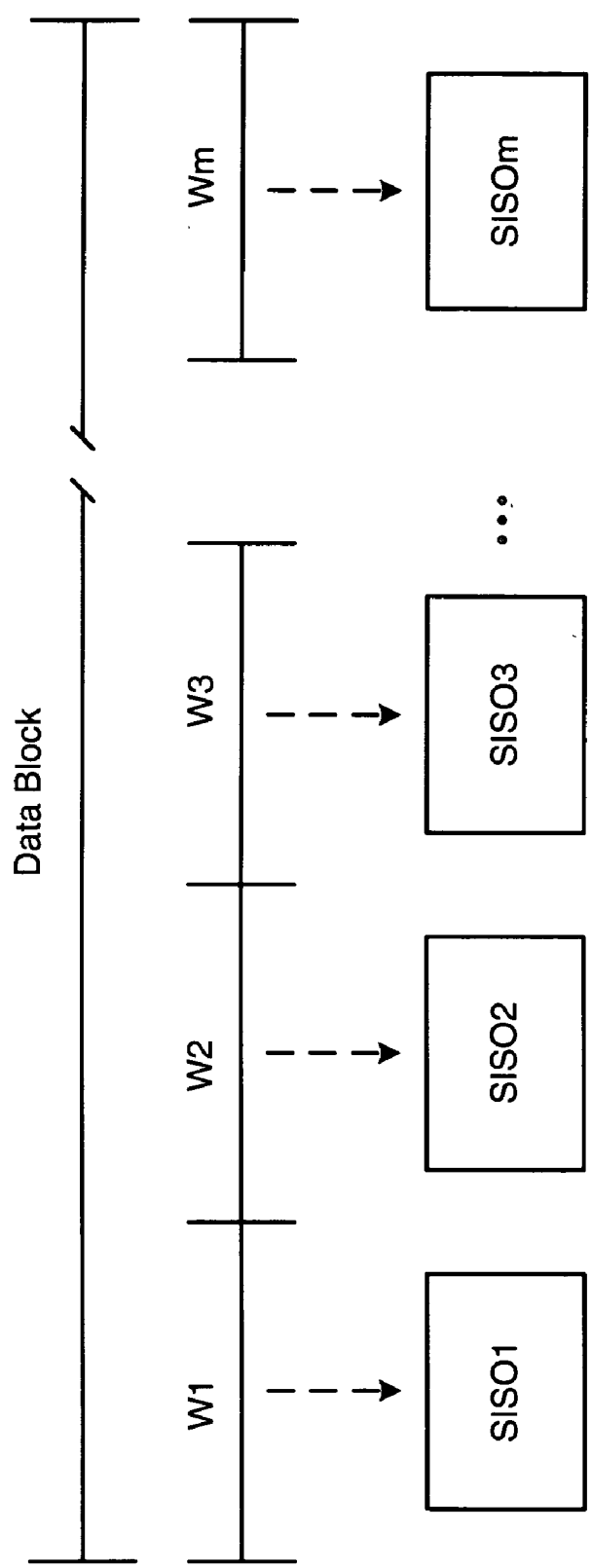
FIG. 1D illustrates parallel operation of m SISO decoders in accordance with embodiments of the invention.

One or more SISO decoders may be operated in parallel to increase the throughput of the decoding process. FIG. 1D illustrates parallel operation of m SISO decoders in accordance with embodiments of the invention. In this configuration, the data block is divided into a plurality of data windows W1 through Wm. One of the plurality of parallel decoders operates to decode a particular data window.

Figure 2:
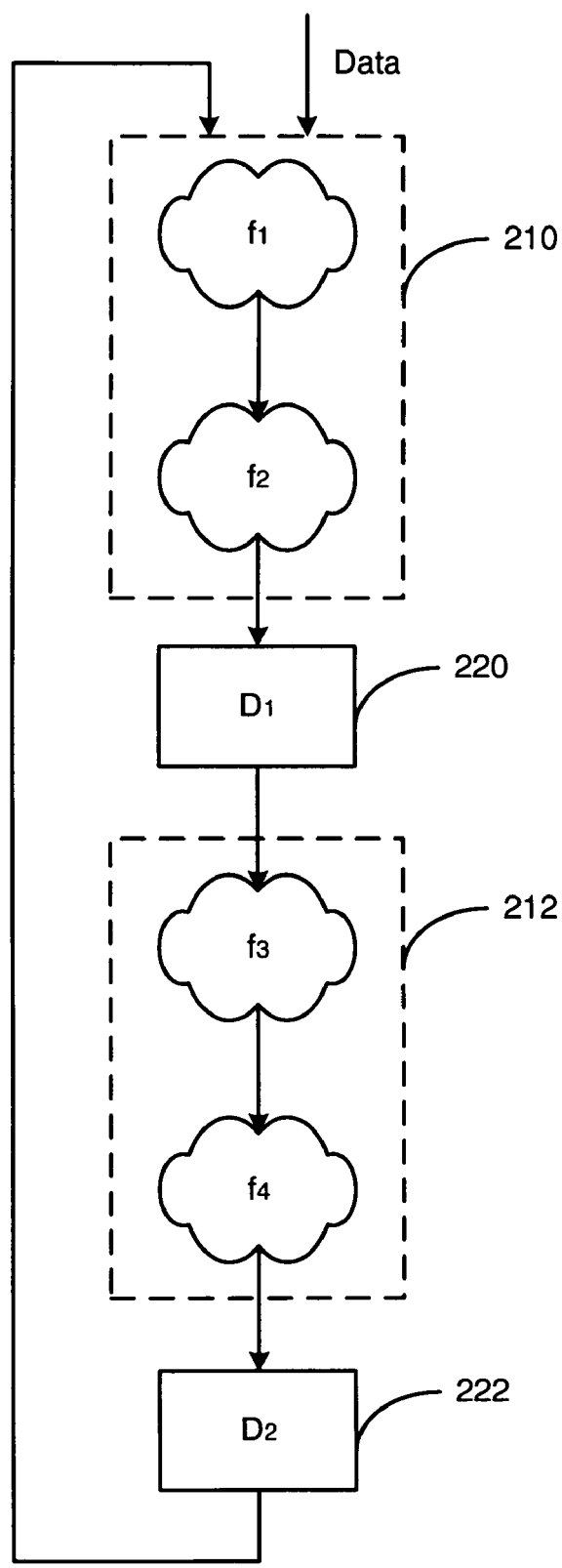
FIG. 2 is a diagram illustrating a process flow of alpha and beta recursion operations in accordance with embodiments of the invention.

FIG. 2 illustrates the process flow of alpha and beta recursion operations in accordance with embodiments of the invention. The alpha and beta recursions may be implemented in a processor as a series of pipelined sub-processes 210, 212 as illustrated in FIG. 2. The pipelined approach involves concurrently operating the sub-processes 210, 212 as the recursion process cascades through the sub-processes 210, 212. In this example, a first sub-process 210 includes operations f1 and f2. A second sub-process 212 includes operations f3 and f4. The operations f1-f4 may be performed by an alpha and beta recursion processor to calculate the alpha and beta probabilities described above.

The alpha recursion involves analyzing the data block in a forward direction from left to right. The beta recursion involves analyzing the data block in a backward direction from right to left. The data sequence is input to the first sub-process 210. The output of the last sub-process 212 is also fed back to the first sub-process 210. Storage elements 220, 222 are provided following each of the sub-processes 210, 212. The storage elements 220, 222 store the result of the previous sub-process 210, 212 for use by a subsequent sub-process 212, 210 in the pipeline.

Figure 3:
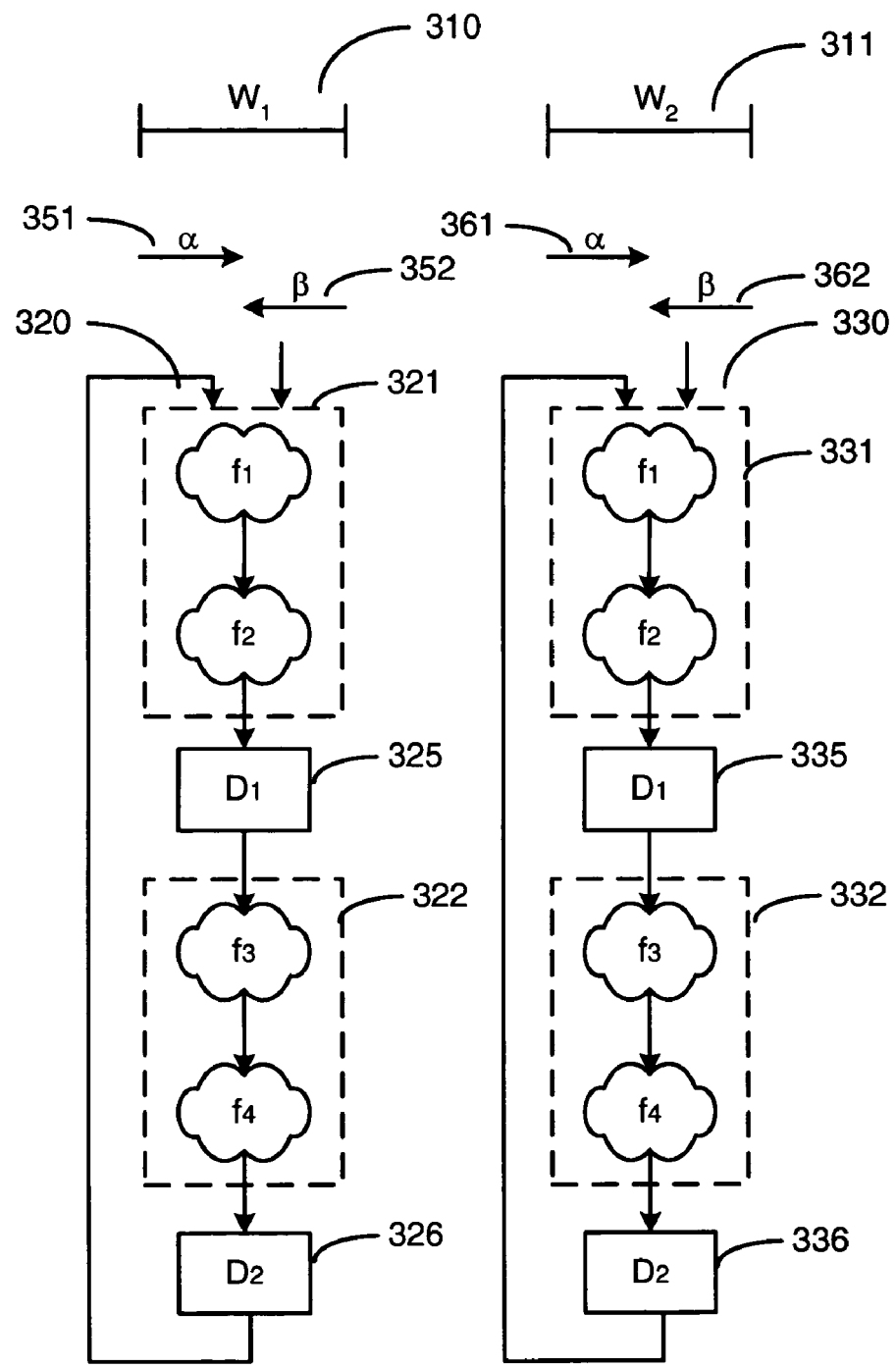
FIG. 3 is a diagram illustrating a process flow for recursion calculations involving first and second recursion processes respectively operating on first and second data windows of a data block in accordance with embodiments of the invention FIG. 4 provides an example of cycle-by-cycle operations of the alpha and beta recursion operations in accordance with embodiments of the invention.

FIG. 3 is a diagram illustrating a process flow for recursion calculations involving first and second recursion processes respectively operating on first and second data windows 310, 311 of the data block in accordance with embodiments of the invention. The first recursion process 320 may be mapped to a first processor and includes two sub-processes 321, 322. The first sub-process 321 includes operations f1 and f2 and may be performed by the first processor. The second sub-process 322 includes operations f3 and f4 and may be performed also by the first processor. The second recursion process 330 may be mapped to a second processor and includes two sub-processes 331, 332. The first sub-process 331 includes operations f1 and f2 and may be performed by the second processor. The second sub-process 332 includes operations f3 and f4 and may be performed also by the second processor.

The above example maps the first and second sub-processes 321, 322 of the first recursion process 320 to one processor and the first and second sub-processes 331, 332 of the second recursion process 330 to a second processor. Other processor configurations are also possible. For example, each sub-process 321, 331, 322, 332 may be mapped to a dedicated processor.

Storage elements 325, 326, 335, 336 are provided following each of the sub-processes 321, 322, 331, 332. The storage elements 325, 326, 335, 336 store the result of the previous sub-process 321, 322, 331, 332 for use by a subsequent sub-process 322, 321, 332, 331 in the pipeline. Storage of each sub-process output may be implemented, for example, using a memory element, e.g., a semiconductor memory, or using a delay element, e.g., an optical delay line.

In this example, the data block is divided into first and second data windows 310, 311. The first recursion process 320 operates on the first data window. The first recursion process performs both the alpha recursion 351 and the beta recursion 352 on the first data window 310. The second recursion process 330 operates on the second data window 311 of the data block. The second recursion process 330 performs both the alpha recursion 361 and the beta recursion 362 on the second data window 311.

Figure 4:
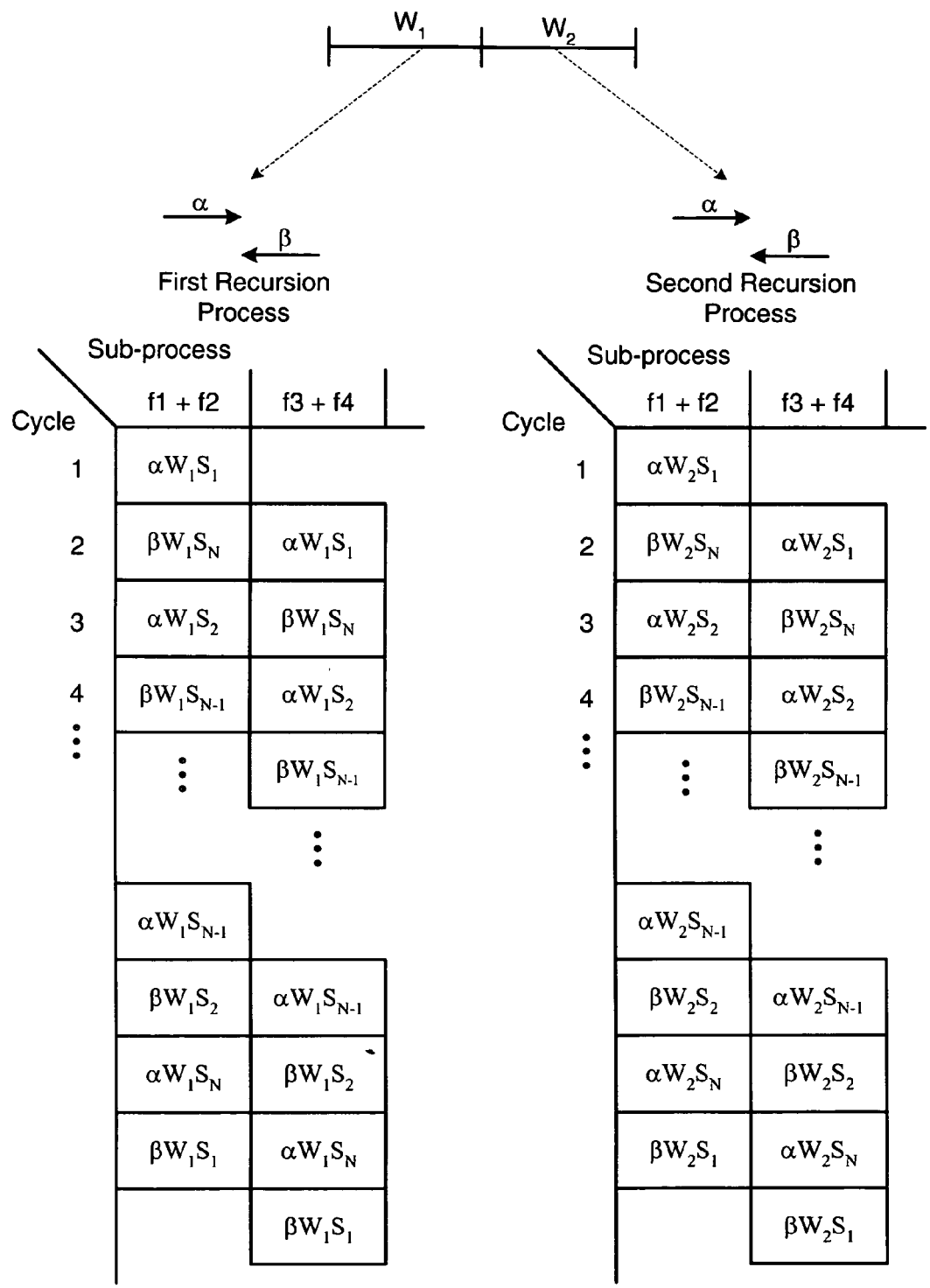

FIG. 4 provides an example of the cycle-by-cycle operation of the alpha and beta recursion operations in accordance with embodiments of the invention. During the first cycle, the first sub-processes of each recursion process perform operations f1 and f2. The first sub-process of the first recursion process performs operations f1 and f2 of an alpha recursion on the first sample of the first data window. The first sub-process of the second recursion process performs operations f1 and f2 of an alpha recursion on the first sample of the second data window.

In the second cycle, the first sub-processes of the first and second recursion processes perform operations f1 and f2. The second sub-processes of the first and second recursion processes perform operations f3 and f4. The first sub-process of the first recursion process performs operations f1 and f2 of a beta recursion on the last sample (N) of the first data window. The second sub-process of the first recursion process performs operations f3 and f4 of an alpha recursion on the first sample of the first data window.

In the second cycle, the first sub-process of the second recursion process performs operations f1 and f2 of a beta recursion on the last sample (N) of the second data window. The second sub-process of the second recursion process performs operations f3 and f4 of an alpha recursion on the first sample of the second data window.

In the third cycle, the first sub-process of the first recursion process performs operations f1 and f2 of an alpha recursion on the second sample of the first data window. The second sub-process of the first recursion process performs operations f3 and f4 of a beta recursion on the last sample (N) of the first data window.

In the third cycle, the first sub-process of the second recursion process performs operations f1 and f2 of an alpha recursion on the second sample of the second data window. The second sub-process of the second recursion process performs operations f3 and f4 of a beta recursion on the last sample (N) of the second data window.

The procedure described above continues with the sub-processes of the first and second recursion processes performing operations f1, f2, f3 and f4 of alpha and beta recursions on the first and second data windows, respectively. The procedure concludes when the f1, f2, f3 and f4 operations of the alpha and beta recursions have been performed on the predetermined number of samples (N).

In the example illustrated in FIG. 4, during a cycle, each recursion process concurrently performs an alpha and a beta recursion process on a particular data window of the data block. For example, during cycle 3, the first recursion process performs an alpha recursion operation on window 1 and a beta recursion operation on window 1. During cycle 3, the second recursion process performs a beta recursion process on the second data window of the data block and an alpha recursion operation on the second data window of the data block.

In the example illustrated in FIG. 4, the first sub-processes of the first and second recursion processes perform alpha recursion operations on odd cycles and beta recursion operations on even cycles. Conversely, the second sub-processes of the first and second recursion processes perform alpha recursion operations on even cycles and beta recursion operations on odd cycles.

Although the example illustrated in FIGS. 3 and 4 illustrates a data block divided into first and second data windows, more or fewer data windows may be employed. Further, although the example illustrated in FIGS. 3 and 4 includes two recursion processes performing operations f1-f4, any number of recursion processes and/or sub-processes may be used. For example, a single recursion process may be used. In such an implementation, the alpha and beta recursion operations may be performed on a first data window followed by alpha and beta recursion operations performed on the second data window, for example.

Figure 5:
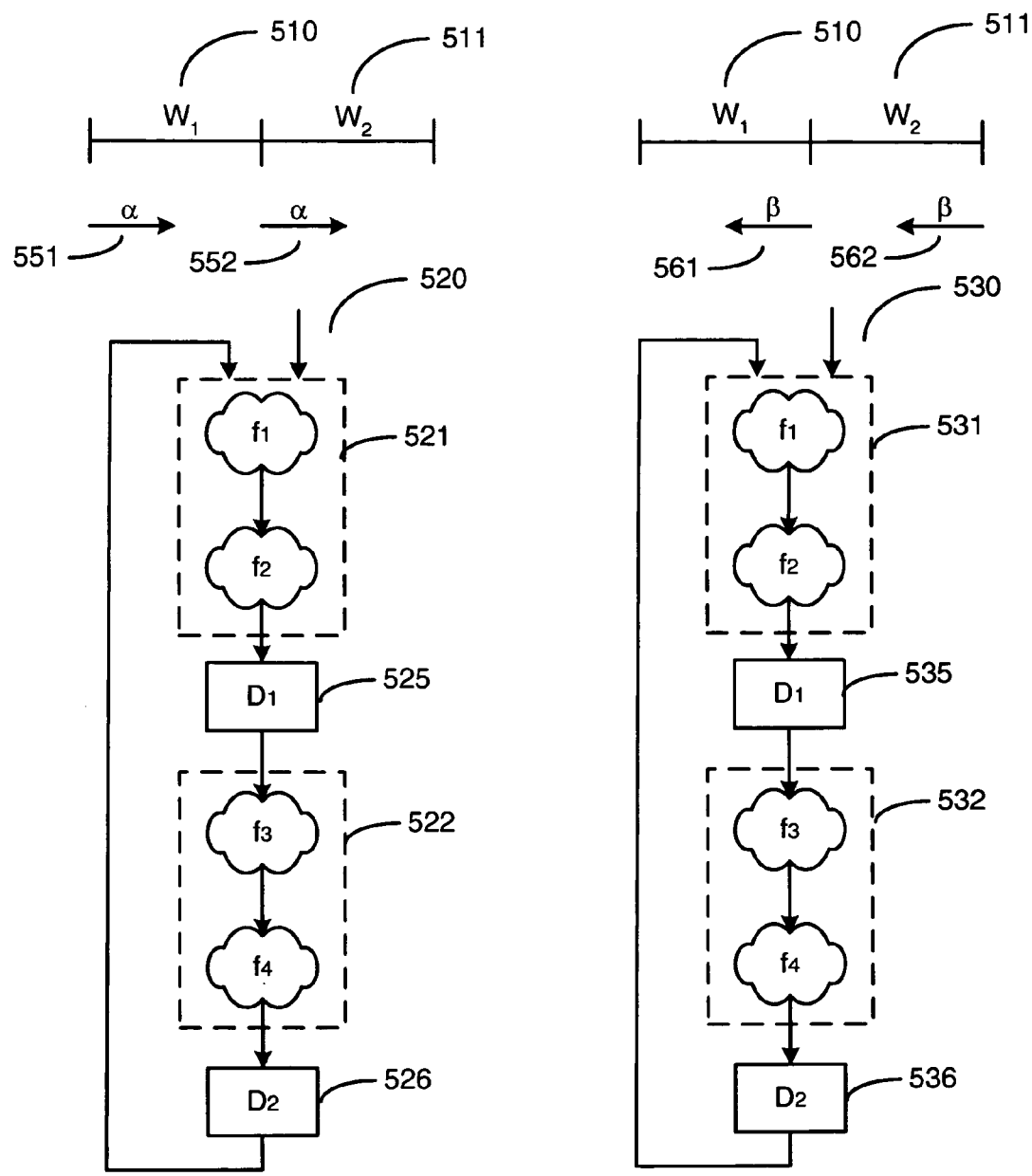
FIG. 5 is a process flow diagram illustrating recursion calculations involving first and second parallel recursion processes respectively performing alpha or beta recursions on first and second data windows of a data block in accordance with embodiments of the invention.

FIG. 5 is a process flow diagram illustrating recursion calculations involving first and second parallel recursion processes 520, 530 respectively performing alpha 551, 552 or beta 561, 562 recursions on first 510 and second 511 data windows of the data block in accordance with embodiments of the invention. In this example, the first recursion process 520 performs alpha recursions 551, 552 on first and second data windows 510, 511 of the data block. A second recursion process 530 performs beta recursions 561, 562 on first and second data windows 510, 511 of the data block. As discussed in connection with FIGS. 3 and 4, the data window may be divided into more or fewer data windows.

The recursion processes 520, 530 discussed in connection with FIG. 5 involve four operations, denoted f1, f2, f3 and f4. Operations f1 and f2 are performed in first sub-processes 521, 531 of the first and second recursion processes 520, 530, respectively. Operations f3 and f4 are performed in second sub-processes 522, 532 of the first and second recursion processes 520, 530, respectively. The recursion processes 520, 530 may alternatively be divided into more or fewer operations performed in more or fewer sub-processes.

The first and second sub-processes 521, 522, 531, 532 of each recursion process 520, 530 are configured in a cascade arrangement with storage elements 525, 526, 535, 536 provided between the sub-processes 521, 522, 531, 532. The D1 storage elements 525, 535 store the outputs of the first sub-processes 521, 531 for use by the second sub-processes 522, 532 in the cascade. The D2 storage elements 526, 536 store the outputs of the second sub-processes 522, 532 for use by the first sub-processes 521, 531 in the cascade.

Figure 6:
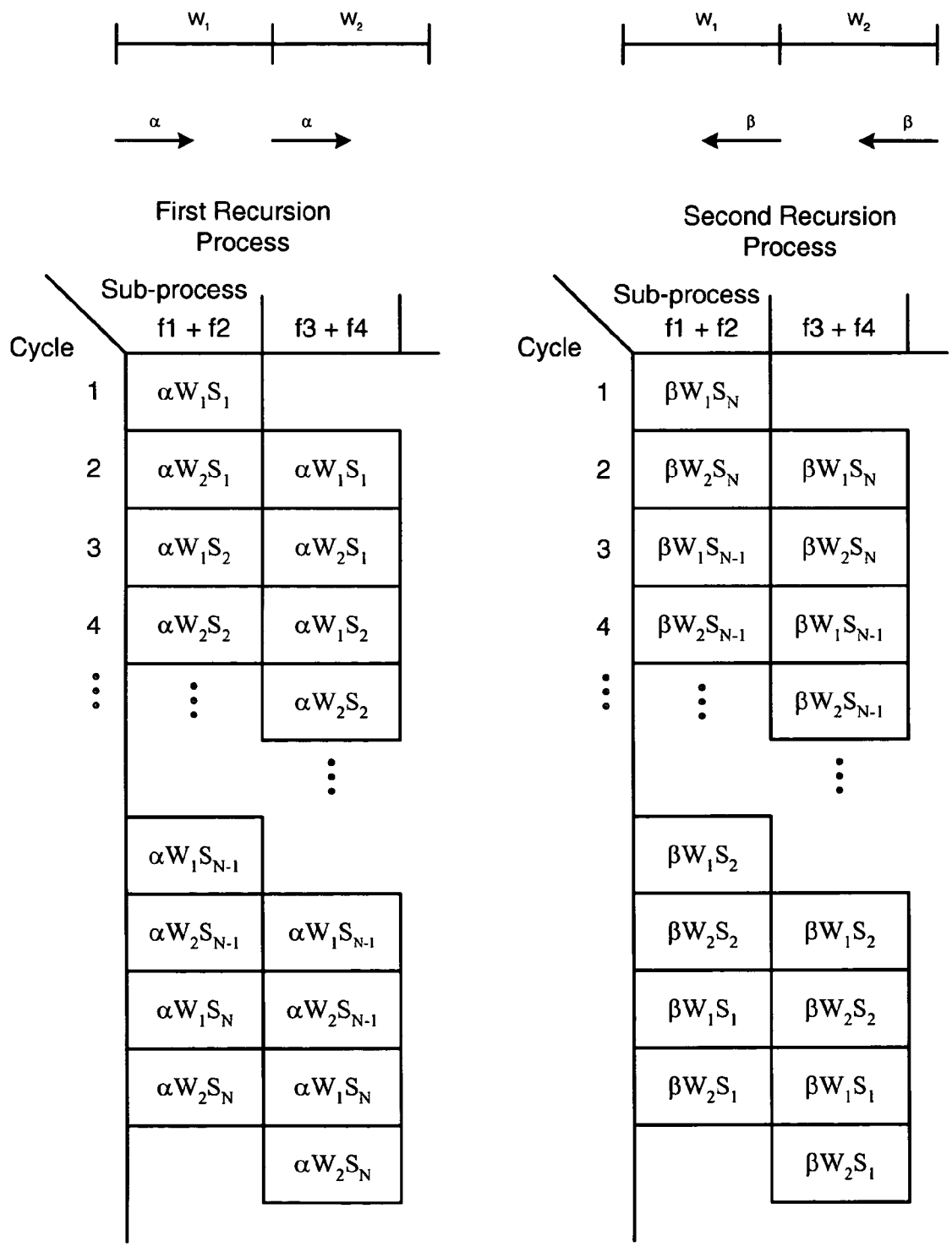
FIG. 6 provides an example of the cycle-by-cycle operation of the alpha and beta recursion operations in accordance with embodiments of the invention.

FIG. 6 provides an example of the cycle-by-cycle operation of the alpha and beta recursion operations in accordance with embodiments of the invention. FIG. 6 illustrates the cycle-by-cycle operation of the configuration illustrated in FIG. 5, wherein first and second recursion processes respectively perform alpha or beta recursions on first and second data windows of the data block. During the first cycle, the first sub-processes of each recursion process perform operations f1 and f2. The first sub-process of the first recursion process performs operations f1 and f2 of an alpha recursion on the first sample of the first data window. The first sub-process of the second recursion process performs operations f1 and f2 of beta recursion on the last sample (N) of the first data window.

In the second cycle, the first sub-processes of the first and second recursion processes perform operations f1 and f2. The second sub-processes of the first and second recursion processes perform operations f3 and f4. The first sub-process of the first recursion process performs operations f1 and f2 of an alpha recursion on the first sample of the second data window. The second sub-process of the first recursion process performs operations f3 and f4 of an alpha recursion on the first sample of the first data window.

In the second cycle, the first sub-process of the second recursion process performs operations f1 and f2 of a beta recursion on the last sample (N) of the second data window. The second sub-process of the second recursion process performs operations f3 and f4 of a beta recursion on the last sample of the first data window.

In the third cycle, the first sub-process of the first recursion process performs operations f1 and f2 of an alpha recursion on the second sample of the first data window. The second sub-process of the first recursion process performs operations f3 and f4 of an alpha recursion on the first sample of the second data window.

In the third cycle, the first sub-process of the second recursion process performs operations f1 and f2 of a beta recursion on sample N−1 of the first data window. The second sub-process of the second recursion process performs operations f3 and f4 of a beta recursion on the last sample (N) of the second data window.

The procedure described above continues with the sub-processes of the first recursion process performing operations f1, f2, f3 and f4 of the alpha recursion on samples of the first and second data windows. The sub-processes of the second recursion process perform operations f1, f2, f3, and f4 of the beta recursion on samples of the first and second data windows. The procedure concludes when the f1, f2, f3 and f4 operations of the alpha and beta recursions have been performed on the predetermined number of samples (N).

In the example illustrated in FIGS. 5 and 6, the first recursion process concurrently performs alpha recursions on first and second data windows of the data block. For example, during cycle 3, the first recursion process performs an alpha recursion operation on the first data window and an alpha recursion operation on the second data window. During cycle 3, the second recursion process performs a beta recursion operation on the first data window of the data block and a beta recursion operation on the second data window of the data block.

In the example illustrated in FIGS. 5 and 6, the first sub-processes of the first and second recursion processes operate on the first data window on odd cycles and on the second data window on even cycles. Conversely, the second sub-processes of the first and second recursion processes operate on the first data window on even cycles and the second data window on odd cycles.

As previously described, the data block may be divided into any number of data windows. Furthermore, any number of recursion processes may be employed to perform the alpha and beta recursions.

Figure 7:
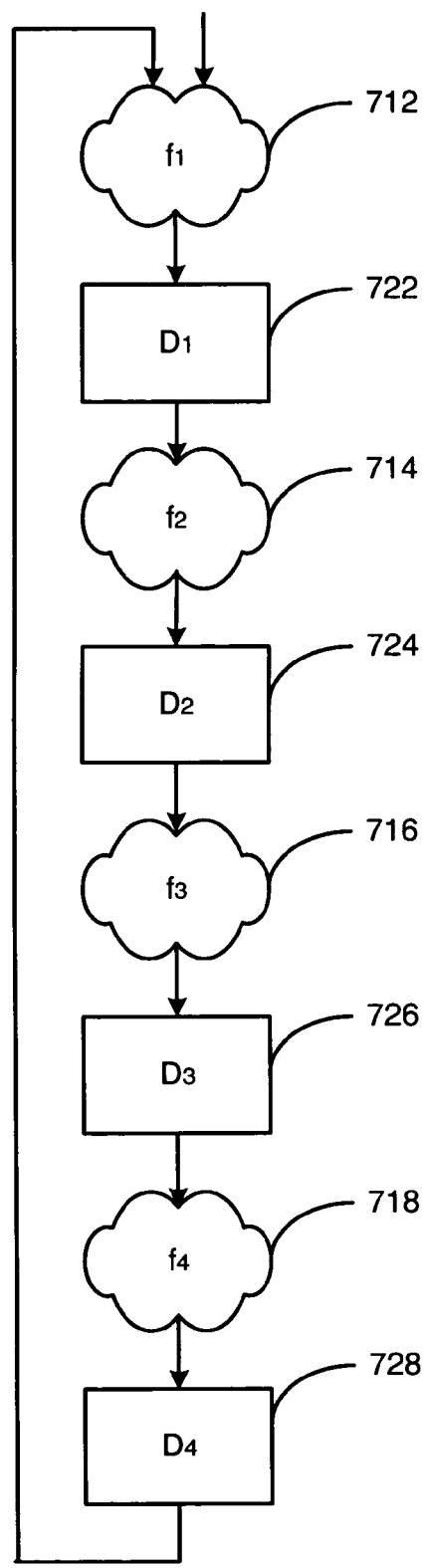
FIG. 7 illustrates a process flow diagram of a recursion process in accordance with embodiments of the invention.

FIG. 7 illustrates a process flow diagram of a recursion process in accordance with embodiments of the invention. In this example, alpha and beta recursions are performed in four cascaded sub-processes 712, 714, 716, 718. A first sub-process 712 performs operation f1, the second sub-process 714 performs operation f2, the third sub-process 716 performs operation f3, and a fourth sub-process 718 performs operation f4. Storage elements 722, 724, 726, 728 are respectively provided following sub-processes 712, 714, 716, 718 to store the output of each sub-process 712, 714, 716, 718 for use by the next sub-process 714, 716, 718, 712 in the cascade. The D1 storage element 722 is provided after the first sub-process 712 and stores the output of the first sub-process 712 for use by the second sub-process 714. The D2 storage element 724 is provided after the second sub-process 714 and stores the output of the second sub-process 714 for use by third sub-process 716. The D3 storage element 726 is provided after the third sub-process 716 and stores the output of the third sub-process 716 for use by the fourth sub-process 718. The D4 storage element 728 is provided after the fourth sub-process 718 and stores the output of the fourth sub-process 718 for use by the first sub-process 712. The output of the last sub-process 718 is applied to the first sub-process 712 along with data input from the data window.

Figure 8:
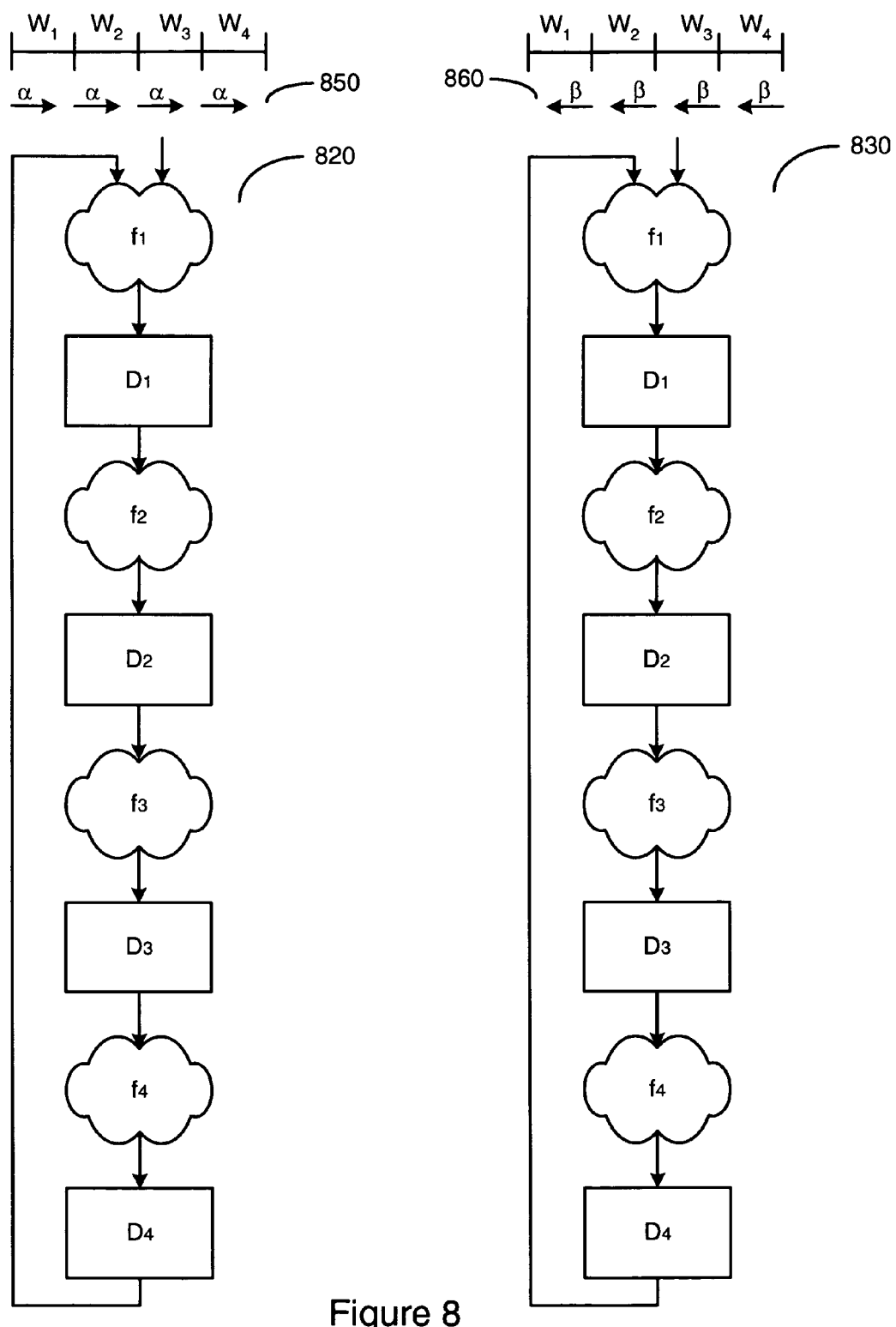
FIG. 8 is a process flow diagram illustrating the operation of two parallel recursion processes with cascaded sub-processes in accordance with an embodiment of the invention.

FIG. 8 is a process flow diagram illustrating the operation of two parallel recursion processes 820, 830 in accordance with an embodiment of the invention. In this example, each of the first and second recursion processes 820, 830 are configured as described in connection with FIG. 7. The first recursion process 820 may be mapped to a first processor. The second recursion process 830 may be mapped to a second processor.

The data block is divided into four data windows, W1, W2, W3, and W4. The first recursion process 820 performs alpha recursions 850 on each of the data windows W1-W4. The second recursion process 830 performs beta recursions 860 on each of the data windows W1-W4.

Figure 9A:
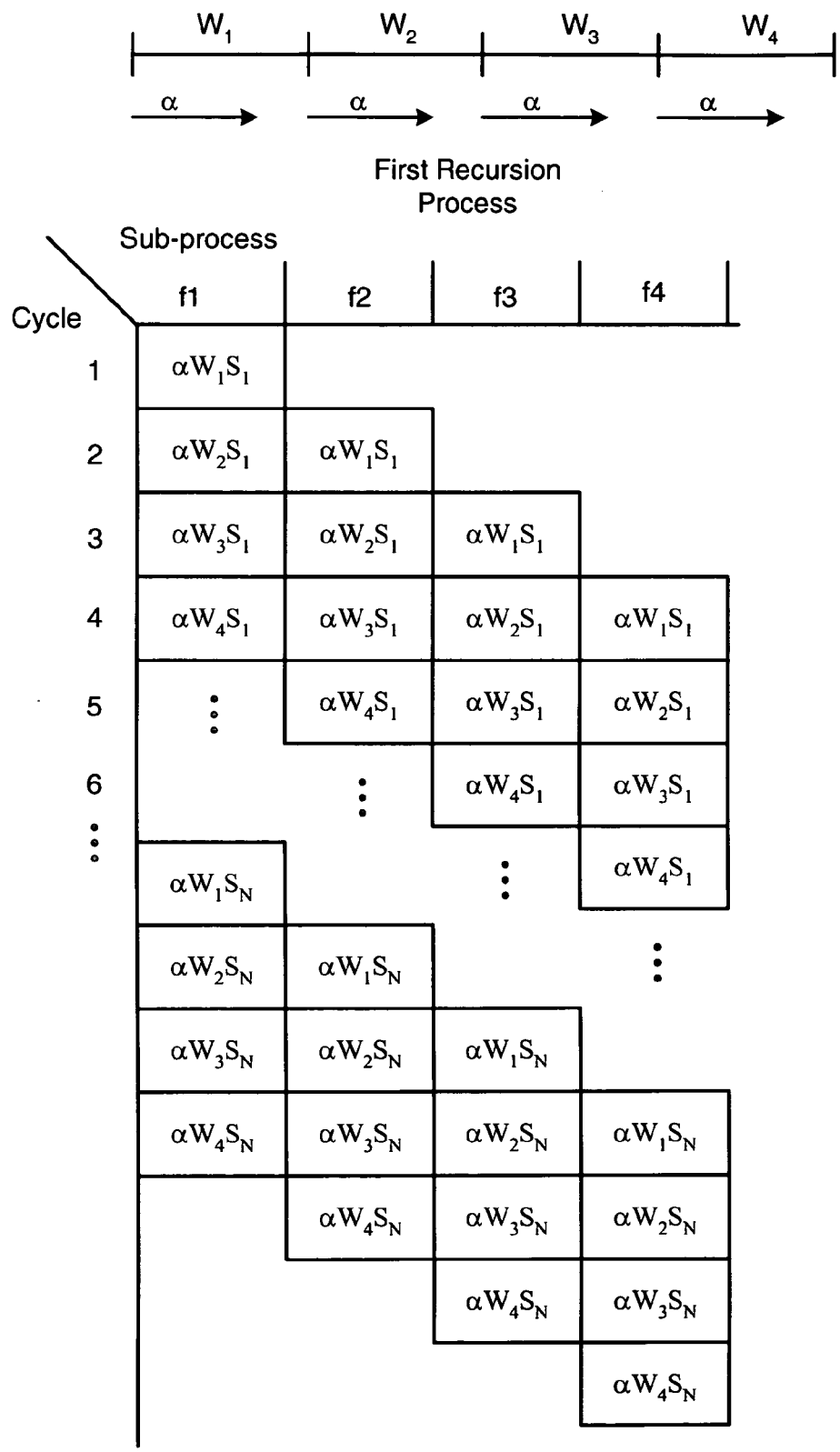
FIGS. 9A and 9B are diagrams illustrating cycle-by-cycle operation of the first and second recursion processes described in connection with FIG. 8 in accordance with embodiments of the invention.
Figure 9B:
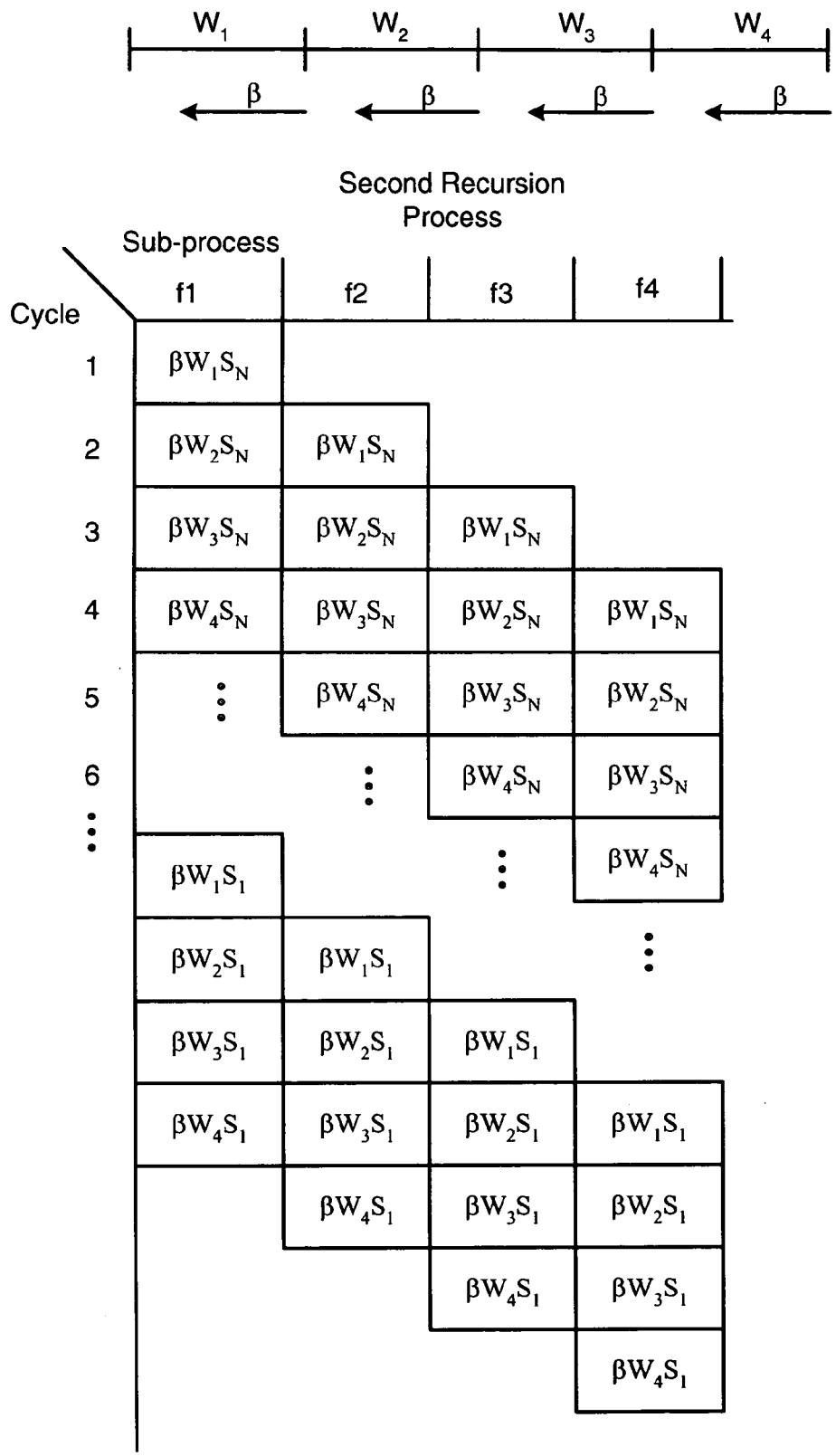

FIGS. 9A and 9B are diagrams illustrating cycle-by-cycle operation of the first and second recursion processes described in connection with FIG. 8 in accordance with embodiments of the invention. In this example, the first recursion process, illustrated in FIG. 9A, performs the alpha recursion on data windows W1-W4. The second recursion process, illustrated in FIG. 9B, performs the beta recursion on data windows W1-W4. In the first cycle, the first sub-process of the first recursion process performs operation f1 of an alpha recursion on the first sample of the first data window. In the first cycle, the first sub-process of the second recursion process performs operation f1 of a beta recursion process on the last sample of the first data window.

In the second cycle, the first sub-process of the first recursion process performs operation f1 of an alpha recursion on the first sample of the second data window. The second sub-process of the first recursion process performs operation f2 of an alpha recursion on the first sample of the first data window. In the second cycle, the first sub-process of the second recursion process performs operation f1 of a beta recursion process on the last sample of the second data window. The second sub-process of the second recursion process performs operation f2 of a beta recursion on the last sample of the first data window.

In the third cycle, the first sub-process of the first recursion process performs operation f1 of an alpha recursion on the first sample of the third data window. The second sub-process of the first recursion process performs operation f2 of an alpha recursion on the first sample of the second data window. The third sub-process of the first recursion process performs operation f3 of an alpha recursion on the first sample of the first data window. In the third cycle, the first sub-process of the second recursion process performs operation f1 of a beta recursion process on the last sample of the third data window. The second sub-process of the second recursion process performs operation f2 of a beta recursion on the last sample of the second data window. The third sub-process of the second recursion process performs operation f3 of a beta recursion on the last sample of the first data window.

The fourth cycle represents the first cycle in which the pipeline is full. In this cycle all of the sub-processes f1, f2, f3, f4 of each recursion process 820, 830 are performed concurrently. In the fourth cycle, the first sub-process of the first recursion process performs operation f1 of an alpha recursion on the first sample of the fourth data window. The second sub-process of the first recursion process performs operation f2 of an alpha recursion on the first sample of the third data window. The third sub-process of the first recursion process performs operation f3 of an alpha recursion on the first sample of the second data window. The fourth sub-process of the first recursion process performs operation f4 of an alpha recursion on the first sample of the first data window.

In the fourth cycle, the first sub-process of the second recursion process performs operation f1 of a beta recursion process on the last sample of the fourth data window. The second sub-process of the second recursion process performs operation f2 of a beta recursion on the last sample of the third data window. The third sub-process of the second recursion process performs operation f3 of a beta recursion on the last sample of the second data window. The fourth sub-process of the second recursion process performs operation f4 of a beta recursion on the last sample of the first data window.

The processes continue as outlined above until the alpha and beta recursions are performed on all samples of all data windows. In the example illustrated in FIGS. 8, 9A and 9B, the first recursion process concurrently performs alpha recursions on one or more of the data windows of the data block. For example, during cycle 4, the first recursion process performs an alpha recursion operation on each of the four data windows W1-W4. The second recursion process concurrently performs beta recursions on one or more of the data windows of the data block. For example, during cycle 4, the second recursion process performs a beta recursion operation on each of the four data windows W1-W4. As previously described, more or fewer data windows may be used and more or fewer sub-processes may be implemented.

Figure 10:
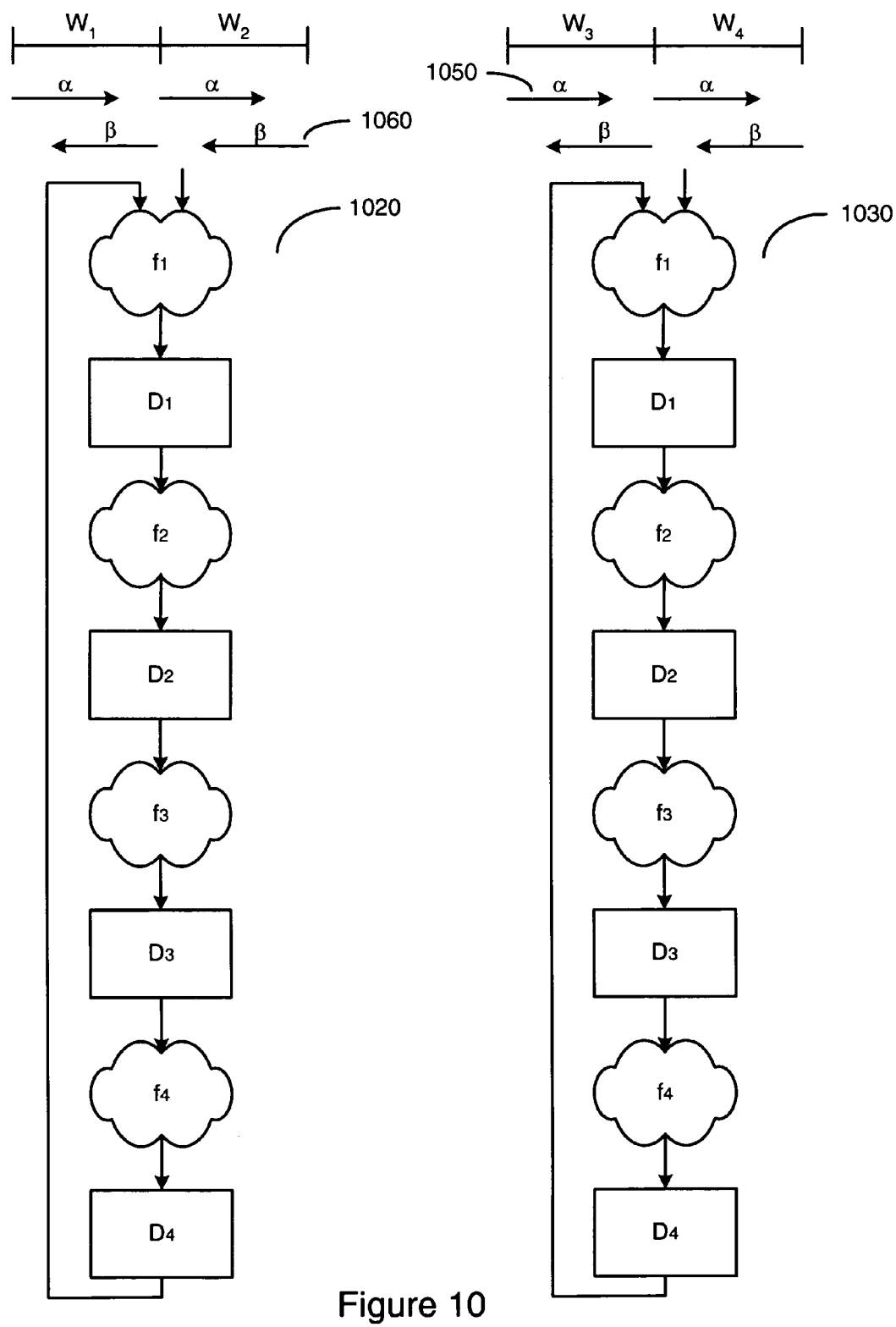
FIG. 10 is a process flow diagram illustrating the operation of two parallel recursion processes with cascaded sub-processes in accordance with embodiments of the invention.

FIG. 10 is a process flow diagram illustrating the operation of two parallel recursion processes 1020, 1030 in accordance with an embodiment of the invention. In this example, first and second recursion processes 1020, 1030 are arranged as described in connection with FIG. 7. The first recursion process 1020 performs alpha 1050 and beta 1060 recursions on data windows W1 and W2 of the data block. The second recursion process 1030 performs alpha 1050 and beta 1060 recursions on third and fourth data windows W3, W4 of the data block.

Figure 11A:
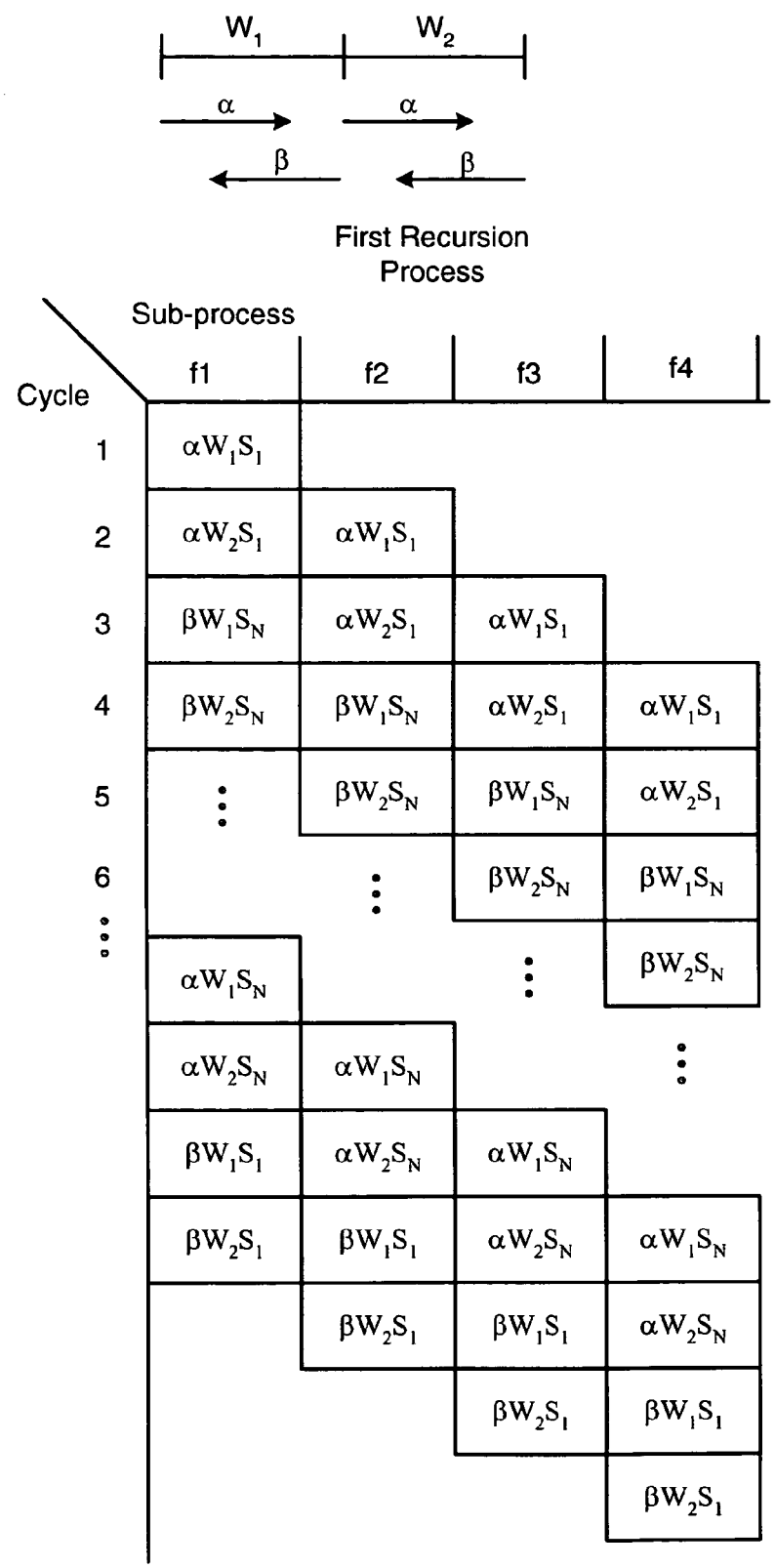
FIGS. 11A-11D are diagrams illustrating cycle-by-cycle operation of first and second recursion processes in accordance with embodiments of the invention.
Figure 11B:
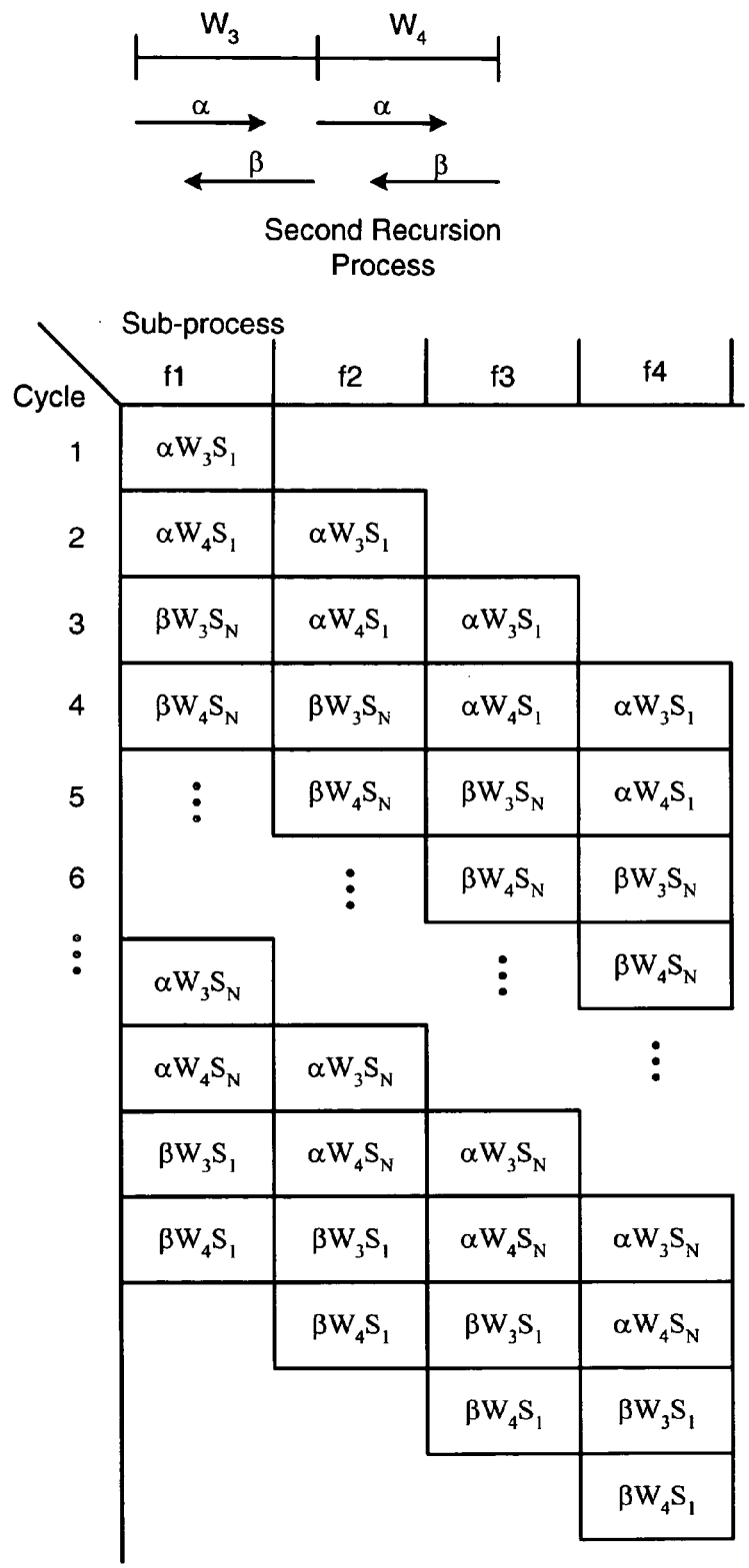

FIGS. 11A and 11B are diagrams illustrating cycle-by-cycle operation of the first and second recursion processes described in connection with FIG. 10 in accordance with embodiments of the invention. In this example, the first recursion process, illustrated in FIG. 11A, performs alpha and beta recursions on data windows W1 and W2. The second recursion process, illustrated in FIG. 11B, performs alpha and beta recursion on data windows W3 and W4. In the first cycle, the first sub-process of the first recursion process performs operation f1 of an alpha recursion on the first sample of the first data window. In the first cycle, the first sub-process of the second recursion process performs operation f1 of an alpha recursion process on the first sample of the third data window.

In the second cycle, the first sub-process of the first recursion process performs operation f1 of an alpha recursion on the first sample of the second data window. The second sub-process of the first recursion process performs operation f2 of an alpha recursion on the first sample of the first data window. In the second cycle, the first sub-process of the second recursion process performs operation f1 of an alpha recursion on the first sample of the fourth data window. The second sub-process of the second recursion process performs operation f2 of an alpha recursion on the first sample of the third data window.

In the third cycle, the first sub-process of the first recursion process performs operation f1 of a beta recursion on the last sample of the first data window. The second sub-process of the first recursion process performs operation f2 of an alpha recursion on the first sample of the second data window. The third sub-process of the first recursion process performs operation f3 of an alpha recursion on the first sample of the first data window. In the third cycle, the first sub-process of the second recursion process performs operation f1 of a beta recursion process on the last sample of the third data window. The second sub-process of the second recursion process performs operation f2 of an alpha recursion on the first sample of the fourth data window. The third sub-process of the second recursion process performs operation f3 of an alpha recursion on the first sample of the third data window.

In the fourth cycle, the first sub-process of the first recursion process performs operation f1 of a beta recursion on the last sample of the second data window. The second sub-process of the first recursion process performs operation f2 of a beta recursion on the last sample of the first data window. The third sub-process of the first recursion process performs operation f3 of an alpha recursion on the first sample of the second data window. The fourth sub-process of the first recursion process performs operation f4 of an alpha recursion on the first sample of the first data window.

In the fourth cycle, the first sub-process of the second recursion process performs operation f1 of a beta recursion process on the last sample of the fourth data window. The second sub-process of the second recursion process performs operation f2 of a beta recursion on the last sample of the third data window. The third sub-process of the second recursion process performs operation f3 of an alpha recursion on the first sample of the fourth data window. The fourth sub-process of the second recursion process performs operation f4 of an alpha recursion on the first sample of the third data window.

The processes continue as outlined above until the alpha and beta recursions are performed on all samples of all data windows. In the example illustrated in FIGS. 10, 11A and 11B, the first recursion process concurrently performs alpha and beta recursions on two of the data windows of the data block. For example, during cycle 4, the first recursion process performs an alpha recursion operation on windows one and two and a beta recursion on windows one and two. The second recursion process concurrently performs alpha and beta recursions on third and fourth data windows of the data block. For example, during cycle 4, the second recursion process performs an alpha recursion and a beta recursion operation on windows three and four. As previously described, more or fewer data windows may be used and more or fewer sub-processes may be implemented.

Figure 11C:
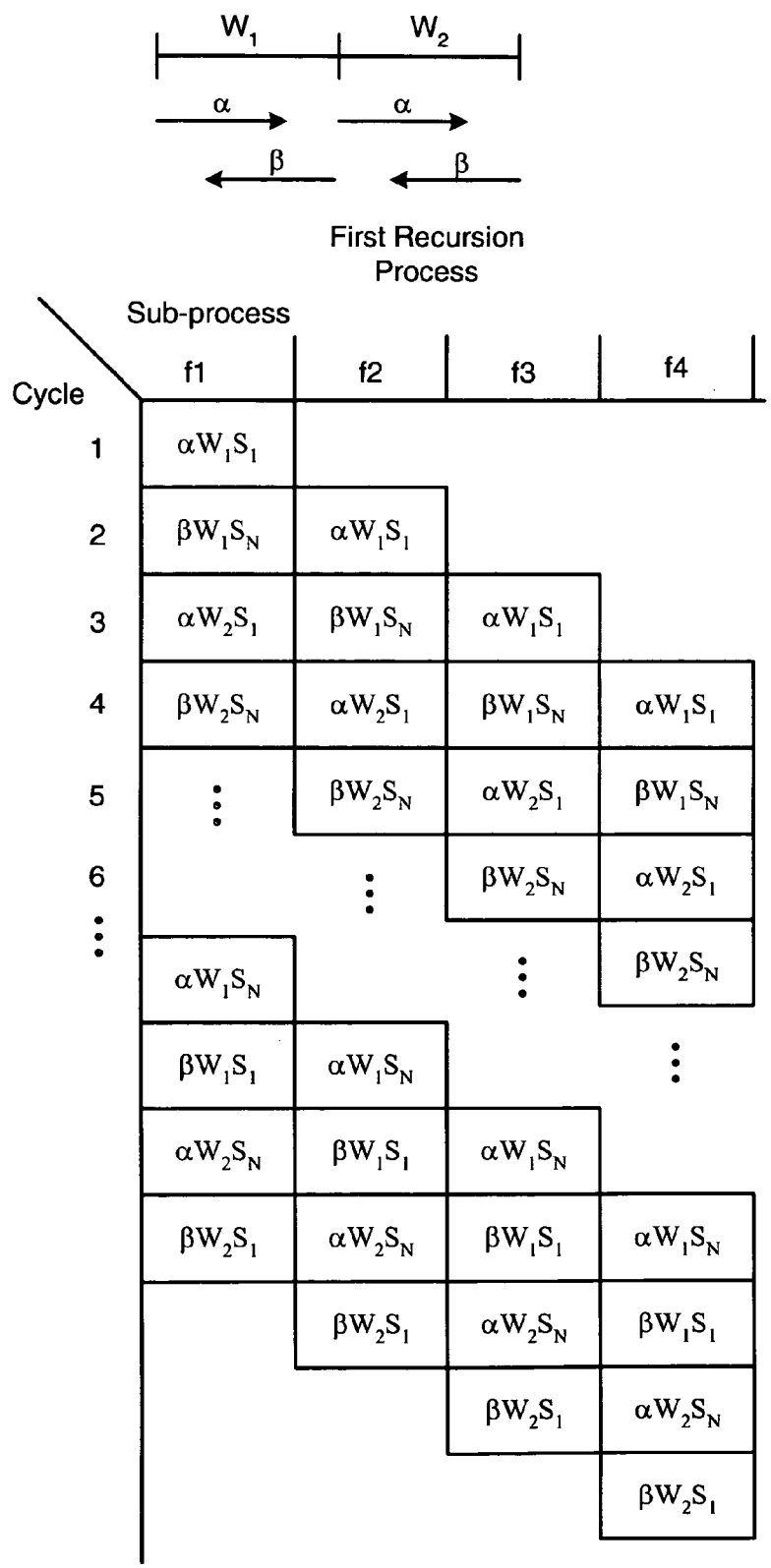
Figure 11D:
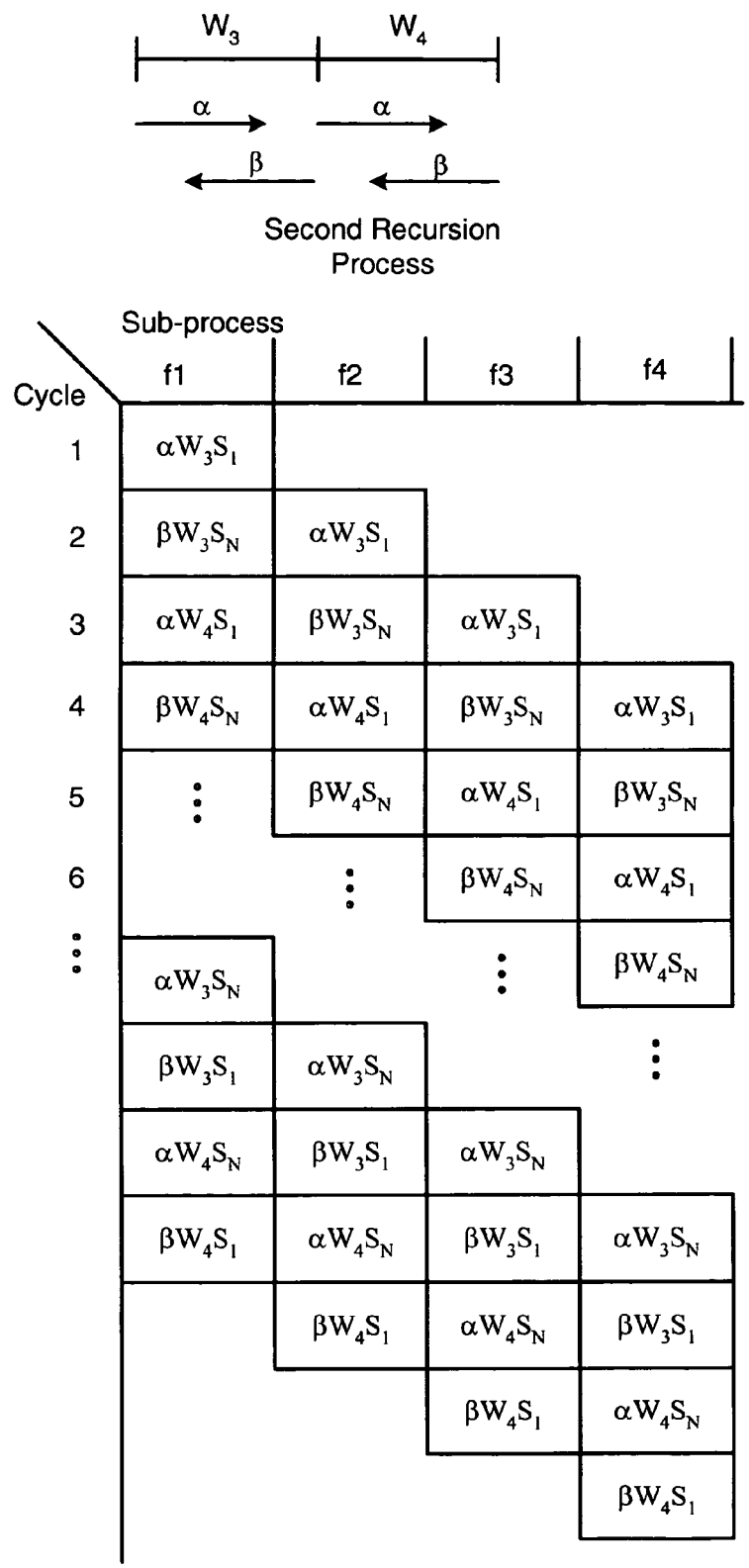

FIGS. 11C and 11D are diagrams illustrating an alternate embodiment of cycle-by-cycle operation of the first and second recursion processes described in connection with FIG. 10 in accordance with embodiments of the invention. In this example, the first recursion process, illustrated in FIG. 11C, performs alpha and beta recursions on data windows W1 and W2. The second recursion process, illustrated in FIG. 11C, performs alpha and beta recursion on data windows W3 and W4. In the first cycle, the first sub-process of the first recursion process performs operation f1 of an alpha recursion on the first sample of the first data window. In the first cycle, the first sub-process of the second recursion process performs operation f1 of an alpha recursion process on the first sample of the third data window.

In the second cycle, the first sub-process of the first recursion process performs operation f1 of a beta recursion on the last sample of the first data window. The second sub-process of the first recursion process performs operation f2 of an alpha recursion on the first sample of the first data window. In the second cycle, the first sub-process of the second recursion process performs operation f1 of a beta recursion on the last sample of the third data window. The second sub-process of the second recursion process performs operation f2 of an alpha recursion on the first sample of the third data window.

In the third cycle, the first sub-process of the first recursion process performs operation f1 of an alpha recursion on the first sample of the second data window. The second sub-process of the first recursion process performs operation f2 of a beta recursion on the last sample of the first data window. The third sub-process of the first recursion process performs operation f3 of an alpha recursion on the first sample of the first data window. In the third cycle, the first sub-process of the second recursion process performs operation f1 of an alpha recursion process on the first sample of the fourth data window. The second sub-process of the second recursion process performs operation f2 of a beta recursion on the last sample of the third data window. The third sub-process of the second recursion process performs operation f3 of an alpha recursion on the first sample of the third data window.

In the fourth cycle, the first sub-process of the first recursion process performs operation f1 of a beta recursion on the last sample of the second data window. The second sub-process of the first recursion process performs operation f2 of an alpha recursion on the first sample of the second data window. The third sub-process of the first recursion process performs operation f3 of a beta recursion on the last sample of the first data window. The fourth sub-process of the first recursion process performs operation f4 of an alpha recursion on the first sample of the first data window.

In the fourth cycle, the first sub-process of the second recursion process performs operation f1 of a beta recursion process on the last sample of the fourth data window. The second sub-process of the second recursion process performs operation f2 of an alpha recursion on the first sample of the fourth data window. The third sub-process of the second recursion process performs operation f3 of a beta recursion on the last sample of the third data window. The fourth sub-process of the second recursion process performs operation f4 of an alpha recursion on the first sample of the third data window.

The processes continue as outlined above until the alpha and beta recursions are performed on all samples of all data windows. In the example illustrated in FIGS. 10, 11C and 11D, the first recursion process concurrently performs alpha and beta recursions on two of the data windows of the data block. For example, during cycle 4, the first recursion process performs an alpha recursion operation on windows one and two and a beta recursion on windows one and two. The second recursion process concurrently performs alpha and beta recursions on third and fourth data windows of the data block. For example, during cycle 4, the second recursion process performs an alpha recursion and a beta recursion operation on windows three and four. As previously described, more or fewer data windows may be used and more or fewer sub-processes may be implemented.

The embodiments presented herein represent a few of the exemplary configurations that may be used in connection with the pipelined architecture approach for implementing a recursion process. The embodiments are described in terms of the alpha and beta recursions performed in connection with a TCC decoder, although the process is equally applicable to any recursive operation. Storage elements may be inserted after each sub-process for any number of sub-processes or operations to implement a pipelined architecture suitable for performing the recursion operations. The storage elements operate to make the output of one sub-process available as an input to the next sub-process in a cascaded configuration. In addition, one or more recursion processes with cascaded sub-processes may be operated in parallel to further increase the speed of the overall process.

In addition to the embodiments described above, other aspects and embodiments of the present invention will be apparent to those skilled in the art from consideration of the specification and practice of the invention disclosed herein. It is intended that the specification and illustrated embodiments be considered as examples only, with a true scope of the invention being indicated by the following claims.

What is claimed is:

1. A method of performing a recursion process on a data block for error correction, comprising:
   concurrently operating pipelined sub-processes of a recursion process on the data block, wherein the pipelined sub-processes perform error correction on the data block and are implemented as sub-circuits in an integrated circuit;
   storing output data from each sub-process; and
   inputting the output data of each sub-process to a subsequent sub-process of the pipelined sub-processes,
   wherein concurrently operating the pipelined sub-processes includes:
      performing a partial calculation by each sub-process, of a probability value output by the recursion process for each sample within the data block; and
      performing by a first sub-process, a partial calculation of the probability value for a first sample in a first cycle, performing by a second sub-process, a partial calculation of the probability value for the first sample in a second cycle that occurs after the first cycle, and performing by the first sub-process, a partial calculation of the probability value for a second sample in the second cycle.

2. The method of claim 1, wherein concurrently operating the pipelined sub-processes comprises concurrently performing a particular recursion operation of the recursion process on a plurality of samples of the data block.

3. The method of claim 1, wherein concurrently operating the pipelined sub-processes comprises concurrently performing a plurality of recursion operations of the recursion process on a particular sample of the data block.

4. The method of claim 1, wherein concurrently operating the pipelined sub-processes comprises:
   concurrently performing a particular recursion operation of the recursion process on a plurality of samples of the data block; and
   concurrently performing a plurality of recursion operations of the recursion process on a particular sample of the data block.

5. The method of claim 1, wherein concurrently operating the pipelined sub-processes comprises concurrently performing a particular recursion operation of the forward/backward recursion process on a plurality of the data windows and a plurality of recursion operations of the forward/backward recursion process on a particular data window.

6. The method of claim 1, wherein storing the output of each sub-process comprises storing the output using a semiconductor memory.

7. The method of claim 1, wherein storing the output of each sub-process comprises storing the output using a delay element.

8. A method of performing a forward/backward recursion process for error correction in decoding an encoded data block, comprising:
   dividing the encoded data block into data windows;
   decoding the data windows with error correction using concurrently operating pipelined sub-processes of the forward/backward recursion process, the pipelined sub-processes implemented as respective sub-circuits of an integrated circuit; and
   storing an output value from each sub-process for input to a subsequent sub-process of the pipelined sub-processes,
   wherein decoding the data windows includes:
      performing a partial calculation by each sub-process, of a an alpha/beta probability value output by the recursion process for each sample within the window; and
      performing by a first sub-process, a partial calculation of the alpha/beta probability value for a first sample in a first cycle, performing by a second sub-process, a partial calculation of the alpha/beta probability value for the first sample in a second cycle that occurs after the first cycle, and performing by the first sub-process, a partial calculation of the alpha/beta probability value for a second sample in the second cycle.

9. The method of claim 8, wherein decoding the data windows comprises concurrently performing a particular recursion operation of the forward/backward recursion process on a plurality of the data windows.

10. The method of claim 9, wherein concurrently performing the particular recursion operation on the plurality of data windows comprises concurrently performing one of an alpha recursion and a beta recursion on the plurality of the data windows.

11. The method of claim 9, wherein concurrently performing the particular recursion operation on the plurality of data windows comprises performing one of a forward recursion and a backward recursion on the plurality of data windows.

12. The method of claim 9, wherein concurrently performing the particular recursion operation on the plurality data windows comprises executing a particular sub-process to perform one of a forward recursion and a backward recursion on a particular data window during alternate processor cycles.

13. The method of claim 8, wherein concurrently operating the pipelined sub-processes comprises concurrently performing a plurality of recursion operations of the forward/backward recursion process on a particular data window.

14. The method of claim 13, wherein concurrently performing the plurality of recursion operations comprises executing a particular sub-process to perform one of a forward recursion and a backward recursion on the particular data window during alternate processor cycles.

15. The method of claim 13, wherein concurrently performing the plurality of recursion operations comprises concurrently performing an alpha recursion and a beta recursion.

16. A data decoder sub-system, comprising:
an input circuit configured to receive an encoded data block; and
one or more processors coupled to the input circuit, the one or more processors implemented in an integrated circuit and configured to concurrently operate pipelined sup-processes of a recursion process that decode the data block with error correction, the one or more processors further configured to store an output of each sub-process for input to a subsequent sub-process of the pipelined sub-processes,
wherein each sub-process performs a partial calculation of a probability value output by the recursion process for each sample within the data block, and
wherein a first sub-process performs a partial calculation of the probability value for a first sample in a first cycle, a second sub-process performs a partial calculation of the probability value for the first sample in a second cycle that occurs after the first cycle, and the first sub-process performs a partial calculation of the probability value for a second sample in the second cycle.

17. The sub-system of claim 16, wherein the pipelined sub-processes concurrently perform a particular recursion operation of the recursion process on a plurality of samples of the data block.

18. The sub-system of claim 16, wherein the pipelined sub-processes concurrently perform a plurality of recursion operations of the recursion process on a particular sample of the data block.

19. The sub-system of claim 16, wherein the recursion process comprises at least one of a forward recursion operation and a backward recursion operation.

20. The subsystem of claim 16, wherein:
the input circuit is configured to divide the data block into data windows; and
the pipelined sub-processes are concurrently operated to perform the recursion process in decoding the data windows.

21. The sub-system of claim 16, wherein:
the recursion process comprises an alpha/beta recursion process; and
the alpha/beta recursion process comprises an alpha recursion operation and a beta recursion operation.

22. The sub-system of claim 16, wherein the recursion process comprises
a forward/backward recursion process; and
the forward/backward recursion process comprises a forward recursion operation and a backward recursion operation.

23. The sub-system of claim 16, wherein the pipelined sub-processes are concurrently operated to perform a particular recursion operation of the recursion process on a plurality of the data windows.

24. The sub-system of claim 23, wherein the particular recursion operation is one of a forward recursion and a backward recursion.

25. The sub-system of claim 23, wherein the particular recursion operation is one of an alpha recursion and a beta recursion.

26. The sub-system of claim 16, wherein the pipelined sub-processes are concurrently operated to perform a plurality of recursion operations of the recursion process on a particular data window.

27. The sub-system of claim 16, wherein the pipelined sub-processes concurrently perform a particular recursion operation of the recursion process on a plurality of the data windows and a plurality of recursion operations of the recursion process on a particular data window.

28. The sub-system of claim 16, wherein each of the one or more processors comprise a memory element that stores the output of each sub-process.

29. The sub-system of claim 16, wherein each of the one or more processors comprise a delay element that stores the output of each sub-process.

30. A turbo decoder system, comprising:
an input circuit configured to receive a data block; and
one or more soft-input-soft-output decoders coupled to the input circuit and configured to decode the data block with error correction, the one or more soft-input-soft-output decoders implemented in an integrated circuit, and at least one of the soft-input-soft-output decoders including,
a gamma calculator configured to calculate a state transition probability produced by a particular input bit of the data block;
an alpha/beta recursion processor coupled to the gamma calculator and configured to perform an alpha/beta recursion process, the alpha/beta recursion processor configured to concurrently operate pipelined sub-processes that perform the alpha/beta recursion process and to store the output of each sub-process for input by a subsequent sub-process of the pipelined sub-processes;
wherein each sub-process performs a partial calculation of a probability value output by the recursion process for each sample within the data block;
wherein a first sub-process performs a partial calculation of the probability value for a first sample in a first cycle, a second sub-process performs a partial calculation of the probability value for the first sample in a second cycle that occurs after the first cycle, and the first sub-process performs a partial calculation of the probability value for a second sample in the second cycle; and
a log-likelihood-ratio processor coupled to the gamma calculator and the alpha/beta recursion processor and configured to provide an estimate of a transmitted data block.

31. The turbo decoder system of claim 30, wherein the pipelined sub-processes concurrently perform a particular recursion operation of the alpha/beta recursion process on a plurality of samples of the data block.

32. The turbo decoder system of claim 30, wherein the pipelined sub-processes concurrently perform a plurality of recursion operations of the alpha/beta recursion process on a particular sample of the data block.

33. The turbo decoder system of claim 30, wherein:
the input circuit is configured to divide the data block into data windows; and
the pipelined sub-processes are concurrently operated to perform the alpha/beta recursion process in decoding the data windows.

34. The turbo decoder system of claim 33, wherein the pipelined sub-processes are concurrently operated to perform a particular recursion operation of the recursion process on a plurality of the data windows.

35. The sub-system of claim 33, wherein the pipelined sub-processes are concurrently operated to perform a plurality of recursion operations of the recursion process on a particular data window.

36. The sub-system of claim 33, wherein the pipelined sub-processes concurrently perform a particular recursion operation of the recursion process on a plurality of the data windows and a plurality of recursion operations of the recursion process on a particular data window.

37. A system for performing a recursion process on a data block for error correction, comprising:

means for concurrently operating pipelined sub-processes of a recursion process on the data block, wherein the pipelined sub-processes perform error correction on the data block and are implemented as respective sub-circuits of an integrated circuit;

means for storing output data from of each sub-process; and means for inputting the output data of each sub-process to a subsequent sub-process of the pipelined sub-processes, wherein each sub-circuit that implements a sub-Process performs a partial calculation of an alpha/beta probability of the forward/backward recursion process for each sample within the data block, and wherein a first sub-process performs a partial calculation of the alpha/beta probability value for a first sample in a first cycle, a second sub-process performs a partial calculation of the alpha/beta probability value for the first sample in a second cycle that occurs after the first cycle, and the first sub-process performs a partial calculation of the alpha/beta probability value for a second sample in the second cycle.

38. A system for performing a forward/backward recursion process for error correction in decoding an encoded data block, comprising:

means for dividing the encoded data block into data windows;

means for decoding the data windows with error correction using concurrently operating pipelined sub-processes of the forward/backward recursion process, the pipelined sub-processes implemented as respective sub-circuits of an integrated circuit; and means for storing output data from each sub-process for input by a subsequent sub-process of the pipelined sub-processes, wherein each sub-circuit that implements a sub-process performs a partial calculation of an alpha/beta probability value of the forward/backward recursion process for each sample within the window, and wherein a first sub-process performs a partial calculation of the alpha/beta probability value for a first sample in a first cycle, a second sub-process performs a partial calculation of the alpha/beta probability value for the first sample in a second cycle that occurs after the first cycle, and the first sub-process performs a partial calculation of the alpha/beta probability value for a second sample in the second cycle.

* * * * *